United States Patent
Jacob

(10) Patent No.: US 7,620,084 B1
(45) Date of Patent: Nov. 17, 2009

(54) METHODS AND SYSTEMS FOR LASER DIODE CONTROL

(75) Inventor: Jonah H. Jacob, Brookline, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 283 days.

(21) Appl. No.: 11/388,843

(22) Filed: Mar. 24, 2006

Related U.S. Application Data

(60) Provisional application No. 60/665,629, filed on Mar. 25, 2005, provisional application No. 60/670,133, filed on Apr. 11, 2005, provisional application No. 60/674,850, filed on Apr. 26, 2005, provisional application No. 60/752,796, filed on Dec. 22, 2005, provisional application No. 60/765,979, filed on Feb. 6, 2006.

(51) Int. Cl.
  *H01S 5/068* (2006.01)
(52) U.S. Cl. .............................. 372/29.023; 372/29.016
(58) Field of Classification Search ............ 372/29.023, 372/29.016
  See application file for complete search history.

(56) References Cited

U.S. PATENT DOCUMENTS

| | | | |
|---|---|---|---|
| 4,896,325 A * | 1/1990 | Coldren | 372/20 |
| 5,033,060 A | 7/1991 | Leger et al. | |
| 5,128,949 A | 7/1992 | Barnes | |
| 5,513,195 A * | 4/1996 | Opower et al. | 372/18 |
| 5,612,968 A * | 3/1997 | Zah | 372/50.12 |
| 5,642,371 A * | 6/1997 | Tohyama et al. | 372/45.01 |
| 6,600,765 B2 | 7/2003 | Evans et al. | |
| 6,822,985 B2 | 11/2004 | Tsunekane et al. | |
| 6,975,164 B1 * | 12/2005 | Matsui et al. | 327/541 |
| 2002/0048292 A1 | 4/2002 | Bissinger et al. | |
| 2005/0147141 A1 | 7/2005 | Sox et al. | |

OTHER PUBLICATIONS

C.J. Corcoran et al. Modal analysis of a self-Fourier laser cavity. J. Opt. A: Pure Appl. Opt. 7 (2005) L1-L7.

C.J. Corcoran et al. Self-Fourier functions and coherent laser combination. J. Phys. A: Math Gen. 37 (2004) L461-L469.

R.H. Rediker et al. Operation of a Coherent Ensemble of Five Diode Lasers in an External Cavity. IEEE J. Quant. Elect. 27(6) Jun. 1991, 1582-1593.

T.Y. Fan. Laser Beam Combining for High-Power, High-Radiance Sources. IEEE J. Sel. Top. Quant. Elect. 11(3) May/Jun. 2005, 567-577.

B.L. Volodin et al. Volume Bragg Gratings (TM) A New Platform Technology for WDM Applications. White paper available at www.pd-ld.com/pdf/VBG_PAPER.pdf. Copyright PD-LD 2003.

G. Venus et al. Spectral stablization of laser diodes by external Bragg resonator. Proc. SSDLTR (2004). Poster-14.

L. Pun. Introduction to Optimization Practice. New York: Wiley & Sons, 1969.

W.H. Press et al. Numerical Recipes in C: The Art of Scientific Computing, 2nd ed. Cambridge Univ. Press 1992. Chapter 10, pp.

(Continued)

*Primary Examiner*—Minsun Harvey
*Assistant Examiner*—Michael Carter
(74) *Attorney, Agent, or Firm*—Burns & Levinson LLP; Jerry Cohen; Orlando Lopez

(57) ABSTRACT

Methods and systems that enable the combining of laser diodes into a laser beam.

1 Claim, 25 Drawing Sheets

OTHER PUBLICATIONS

U. Brauch et al. High-Power Diode Lasers for Direct Applications. Heidelberg: Springer-Berlin 2000.

Hori, Y. et al. Analysis of TE and TM Modes in DFB Lasers by Two-Dimensional Theory. IEEE J. of Quantum Elect. 27(7) Jul. 1991, 1874-1885.

Oishi, M. et al. MOVPE-Grown 1.5 μm Distributed Feedback Lasers on Corrugated InP Substrates. IEEE J. of Quantum Elect. QE-23(6), Jun. 1987, 822-827.

Verdeyen, J.T. Laser Electronics (2nd Ed.) Englewood Cliffs, NJ: Prentice Hall 1981, 386-392 and 487-497.

* cited by examiner $\Delta T := 0, 1 .. 200$ $\Delta \lambda(t) := 0.25 \cdot \Delta T$ ➢ *Fluorescence spectra also shows mode structure*
- Fringe spacing corresponds to ½ wave phase shift
- To detect λ/20 one one must have the capability to measure to 1/10th of a fringe Laser Diode Bar with Integrated Fault Protection ➢ *A volume Bragg grating could allow for narrow line extraction, perhaps a single longitudinal mode*
- By inserting facets with reflectivity in the fluorescence band but transparent in the lasing band, the fluorescence mode structure can be observed
- This will allow one to observe phase changes in each emitter that could disrupt the the phase locked array

METHODS AND SYSTEMS FOR LASER DIODE CONTROL

CROSS REFERENCE TO RELATED APPLICATIONS

This application claims priority of U.S. Provisional Application 60/665,629 filed on Mar. 25, 2005, which is herein incorporated by reference, and of U.S. Provisional Application 60/670,133 filed on Apr. 11, 2005, which is herein incorporated by reference, U.S. Provisional Application 60/674,850 filed on Apr. 26, 2005, which is herein incorporated by reference, U.S. Provisional Application 60/752,796 filed on Dec. 22, 2005, which is herein incorporated by reference, U.S. Provisional Application 60/765,979 filed on Feb. 6, 2006, which is also herein incorporated by reference.

FIELD OF THE INVENTION

The present invention relates to laser diodes, and more particularly to methods and systems for laser diode control.

BACKGROUND OF THE INVENTION

A semiconductor laser (laser diode) transforms electrical energy into optical energy with relatively high efficiency. A laser diode is typically includes a layer of p-type semiconductor material adjacent to a layer of n-type semiconductor material (referred to as a p-n junction). When electrical current passes from the p-type layer to the n-type layer, stimulated emission of optical radiation results in the active layer. In practice, the stimulated emission is limited to only the active layer. The opposing end faces of the active region are called the facets, which are cleaved and/or etched to define a laser cavity between the two facets. A highly reflective dielectric coating is usually deposited on one facet (the non-output facet), and a semi-reflective dielectric coating on the other facet (the output coupling facet). The optical energy generated by the electric current oscillates between the output facet and the non-output facet, and is partially transmitted by the semi-reflective coating at the output facet to produce a diode laser output beam.

The use of lasers has dramatically increased over the past few years. As the technology has matured, organizations have greatly increased its use of lasers. High-power beams from laser diodes are of interest in solid-state laser pumping and telecommunications. Many industrial and medical applications also required high power density to be delivered to a particular site or point.

Since diode lasers are obtainable at relatively low cost, is desirable to combine the output of several or many laser diodes in order to obtain a high-power laser beam. However there are several difficulties in doing this. Several methods have been developed to combine the output of laser diodes but these methods are typically not very efficient and require expensive components with high loss.

There is a need for methods and systems that enable the combining of laser diodes.

BRIEF SUMMARY OF THE INVENTION

Methods and systems that enable the combining of laser diodes are disclosed.

One embodiment of the method of this invention includes the steps of a. determining an indicator of phase of electromagnetic radiation emitted from a laser diode, b. comparing the indicator of phase to predetermined indicator behavior, and c. modifying operating conditions of the laser diode, if comparison results are not within a predetermined range.

Other various embodiments of the method of this invention and systems that implement the methods are disclosed.

For a better understanding of the present invention, together with other and further objects thereof, reference is made to the accompanying drawings and detailed description and its scope will be pointed out in the appended claims.

BRIEF DESCRIPTION OF THE DRAWINGS

FIG. 6b is a schematic block diagram representation of a detailed embodiment of the system of FIG. 6a;

DETAILED DESCRIPTION

Methods and systems that enable the combining of laser diodes into a higher powered laser beam are disclosed here in below.

According to one explanation, although this invention is not bound to only that explanation, gain and absorption are related in semi-conductor laser media; absorption and refractive index are related in materials (in most cases by the Kramer-Konig relations); the refractive index determines the phase of the semiconductor laser emitted electromagnetic radiation. According to the above explanation, the nonuniform heating of the laser junction can have a significant effect on the refractive index and therefore on the phase. The effect of temperature on the refractive index can be significant. Also according to the above explanation, the Refractive index changes due to a change in the electron/hole density. This change will follow the current density change. The phase can also be altered by changes in the mode structure due to changes, induced by temperature, in the optical length of the cavity. Control of the current density can also compensate for these changes.

However, independent of how the phase is altered, the alteration of the phase has important consequences. (Not desiring to be bound by theory, all alternate explanations are within the scope of this invention.) In order to coherently combine laser diode beams (or any other beams of electromagnetic radiation), the phase must be substantially the same.

Method and system for the detection of anomalies in diode junction behavior are disclosed in U.S. patent application Ser. No. 10/922,753, which is incorporated by reference herein. Although the methods and systems disclosed herein below are presented regarding the comparing of an indicator of the phase of the emitted radiation, it should be noted that the methods and systems of this invention also include in the scope of this invention the variations in phase due to temperature fluctuations in the diode junction.

In this invention, methods and systems for controlling the phase of the emitted electromagnetic radiation (from laser diodes) are disclosed. Applying these methods and systems, the coherent combining of laser diode beams is facilitated or enabled.

Figure 1:
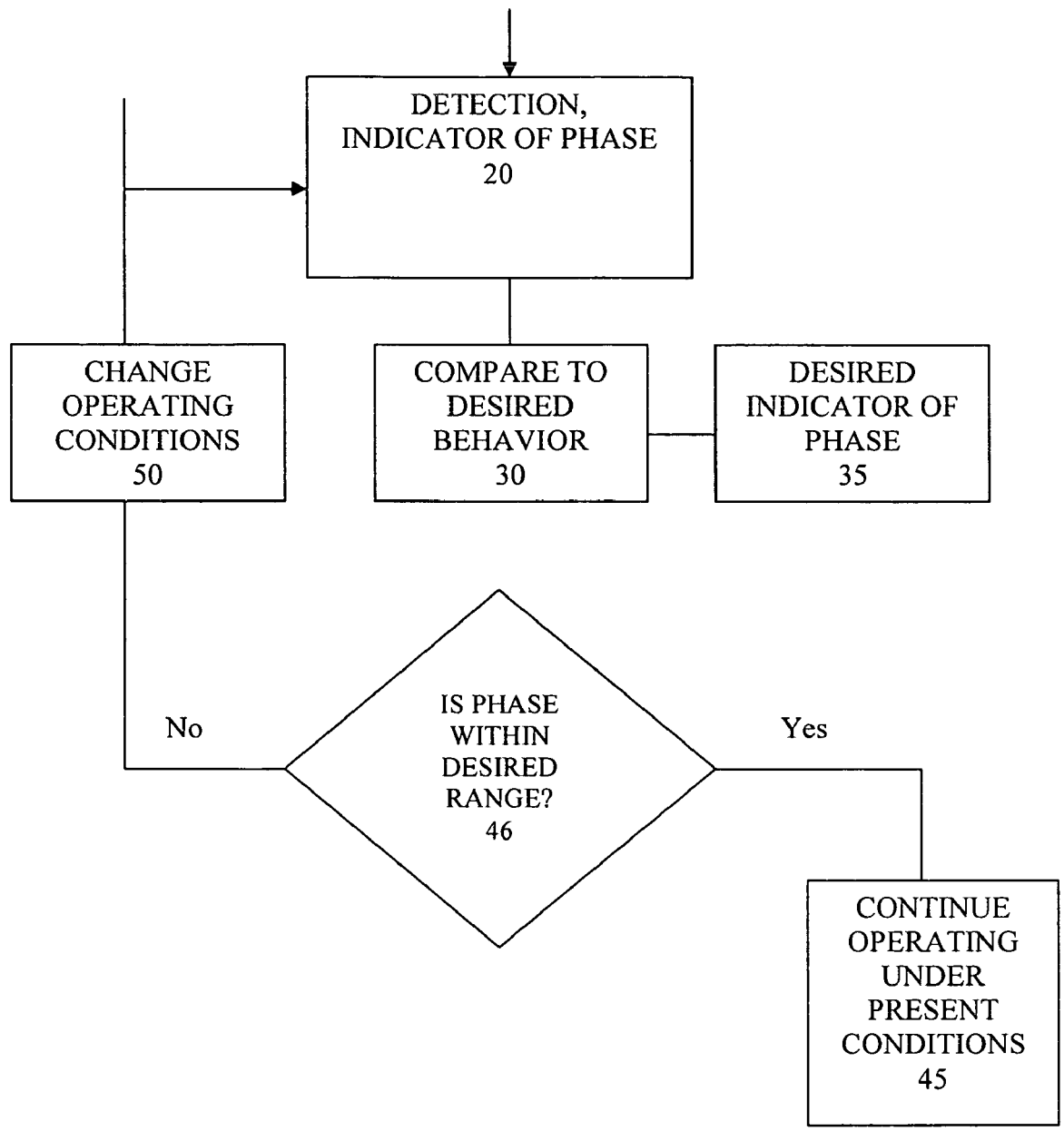
FIG. 1 is a flowchart representation of an embodiment of the method of this invention.

FIG. 1 depicts a flowchart representation 10 of one embodiment of the method of this invention. Referring to FIG. 1, in an embodiment 10 of the method of this invention, diode behavior indicative of the phase of the emitted electromagnetic radiation is detected (step 20, FIG. 1). An indicator of the desired behavior of the phase of the emitted electromagnetic radiation has been previously determined (step 25, FIG. 1). The detected indicator of the phase is compared to the desired phase indicator (step 30, FIG. 1). The desired indicator of phase can, in one embodiment, be obtained by measurements. If the detected indicator of the phase is within the desired range, diode operation continues on there in the same operating conditions as existed at the beginning of the method (step 45, FIG. 1). If the detected indicator of the phase is not within the desired range, the operating conditions are changed in order to alter the detected indicator of the phase so that it is closer to the desired value (step 50, FIG. 1). It should be noted that the change in operating conditions can include diverting power away from the diode. In another embodiment, after a predetermined time, which is dependent on various factors discussed below, power is reapplied to the diode. In some embodiments, it may not be necessary to remove the all the power, but instead decrease the power.

Figure 2:
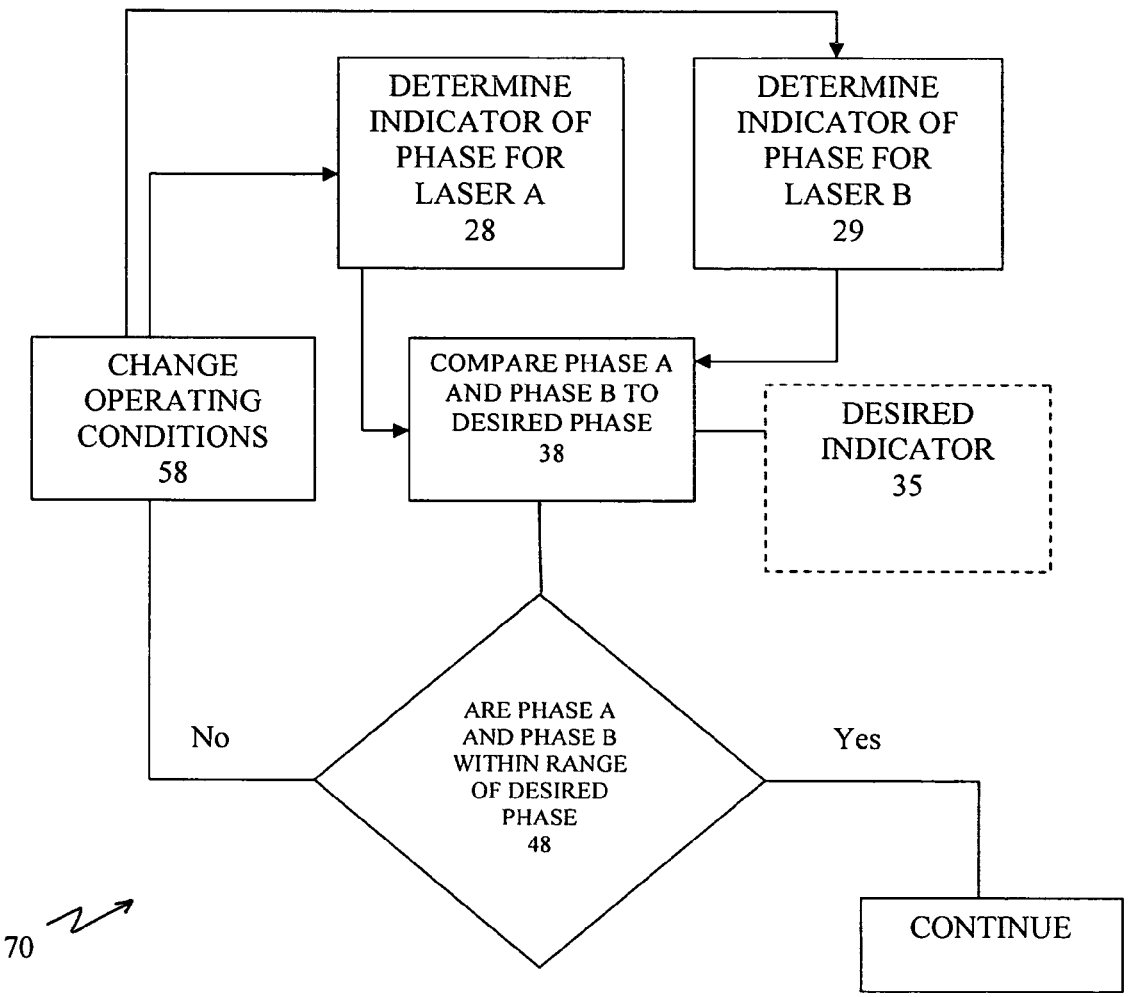
FIG. 2 is a flowchart representation of another embodiment of the method of this invention.

FIG. 2 depicts a flowchart representation of another embodiment 70 of the method of this invention. In one instance, a number of laser diodes are provided and the method of FIG. 1 is applied to each the laser diodes. Referring to FIG. 2, in the embodiment 70, an indicator of the phase is obtained for laser diode A (step 28, FIG. 2) and an indicator of the phase of the radiation emitted from laser diode B is also obtained (step 29, FIG. 2). The phase indicator for laser diode A and the phase indicator for laser diode B are compared to the desired indicator (step 38, FIG. 2). It should be noted that in one embodiment the desired indicator of phase is the phase of either laser A or laser B. If the phase indicator of laser A and the phase indicator of laser B are within the desired range, operation continues under the operating conditions existing at the beginning of the method. If the detected indicator of the phase is not within the desired range, the operating conditions are changed in order to alter the detected indicator of the phase so that it is closer to the desired value (step 58, FIG. 2). While FIG. 2 depicts the determination of an indicator of phase for two lasers, laser A and laser B, it should be noted that the method can be applied to a number of lasers.

Figure 3A:
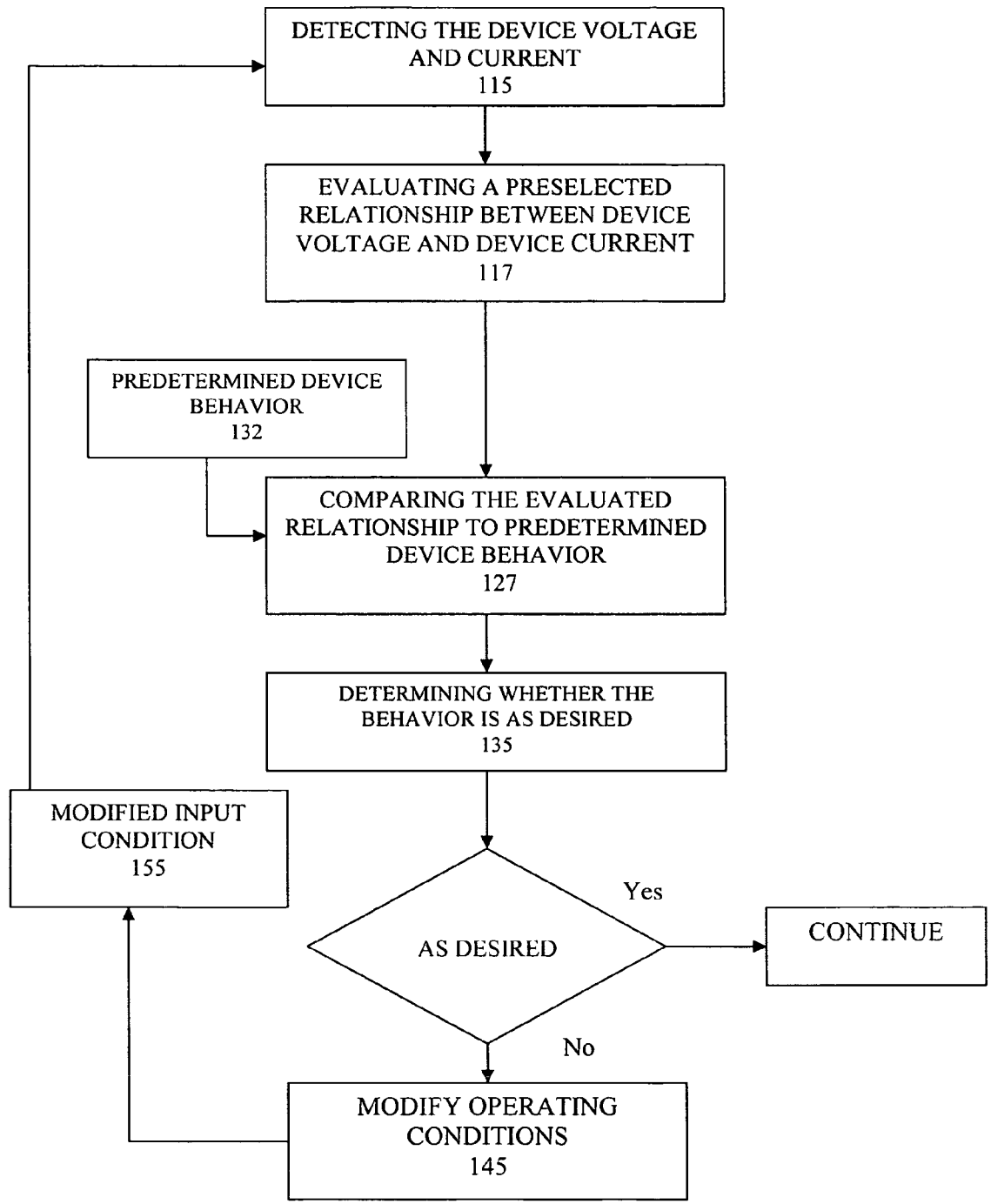
FIG. 3a is a flowchart representation of a detailed embodiment of the method of this invention.

FIG. 3a shows a flowchart representation 100 of a detailed embodiment of the method of this invention. Referring to FIG. 3a, the device voltage, V(t), and the device current, I(t), are measured (step 115, FIG. 3a). In one embodiment of the invention, the relationship between the device terminal voltage and current (Step 117, FIG. 3a) and its relationship to the active junction temperature can be calibrated for each type of diode so that an indicator of the phase of the emitted radiation can be determined from measuring a relationship between the device terminal voltage and the device current such as, but not limited to, the diode terminal impedance. Whether the behavior is as desired is determined by comparing (step 127, FIG. 3a) a relationship between the device terminal voltage and the device current, V(t)/I(t) in one embodiment, to a predetermined value of the relationship between the device terminal voltage and the device terminal current (step 135, FIG. 3a). It should noted that predetermined values of the relationship between the device terminal voltage and the device terminal current could be generated previously from a number of previous observations. If the relationship between the device terminal (or junction) voltage and the device terminal current, in one embodiment the device impedance, V(t)/I(t), is not as indicated by the predetermined behavior, the operating conditions are changed in order to alter the detected relationship so that it is closer to the desired value (step 145, FIG. 3a). This embodiment can include the additional steps of applying the modified input conditions (step 155, FIG. 3a) and repeating steps 115 through 135 in order to determine whether the diode behavior is as expected.

Figure 3B:
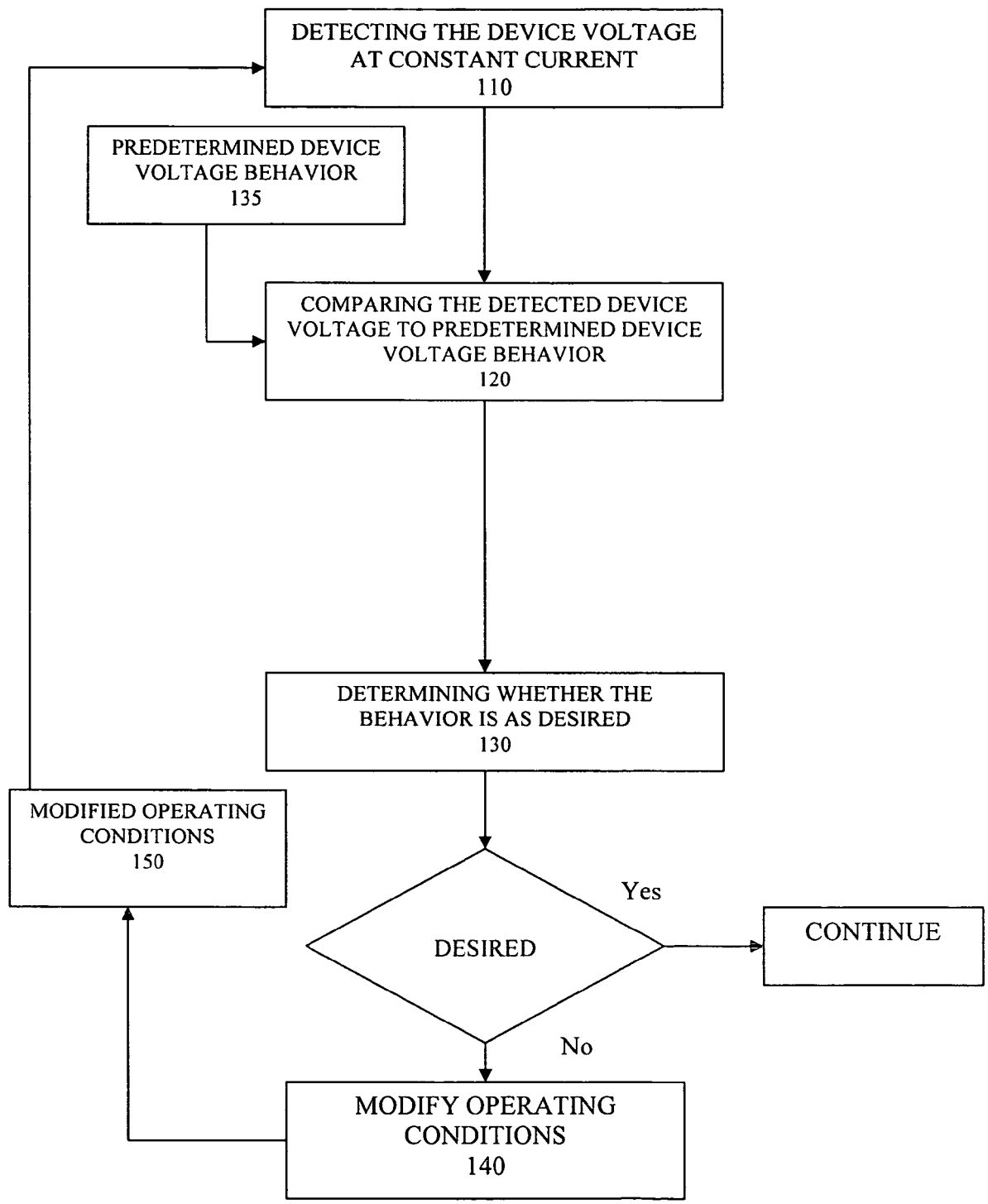
FIG. 3b is a flowchart representation of another detailed embodiment of the method of this invention.

FIG. 3b shows a flowchart representation 105 of a detailed embodiment of the method of this invention. Referring to FIG. 3b, the device voltage, V(t), is measured (step 110, FIG. 3b) at constant current. In one embodiment of the invention, the relationship between the diode terminal voltage at the equilibrium current and its relationship to the active junction temperature can be calibrated for each type of diode so that the phase of the emitted radiation can be determined from measuring diode terminal voltage. If the behavior of the device terminal (or junction) voltage is not as indicated by the predetermined behavior, the operating conditions are changed in order to alter the detected relationship so that it is closer to the desired value (step 130, FIG. 3b). This embodiment can include the additional steps of applying the modified input conditions (step 140, FIG. 3b) and repeating steps 110 through 130 in order to determine whether the diode behavior is as expected.

Figure 3C:
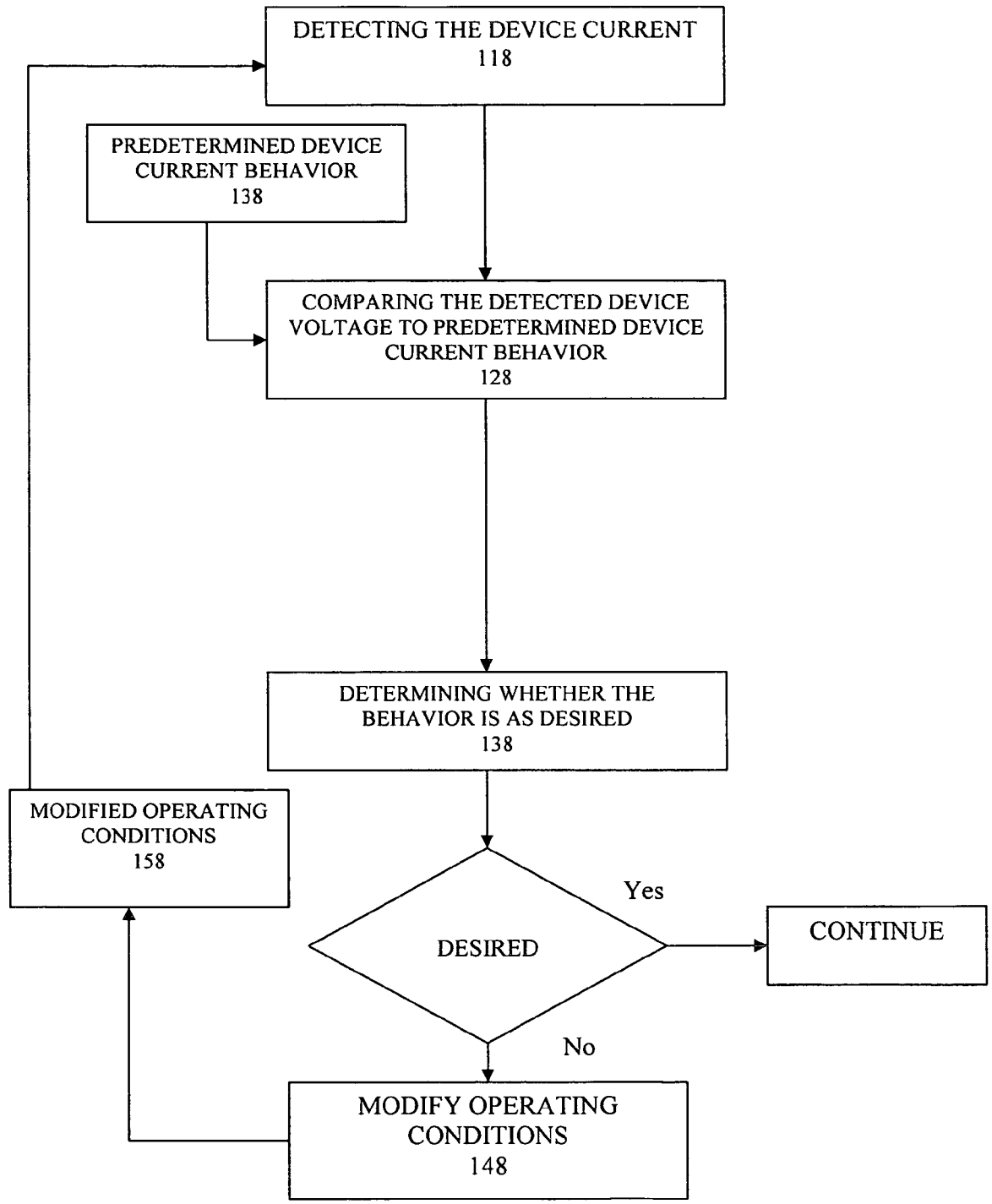
FIG. 3c is a flowchart representation of a further detailed embodiment of the method of this invention.

FIG. 3c shows a flowchart representation 108 of another detailed embodiment of the method of this invention in which the device current, I(t), is measured (step 118, FIG. 3c).

The junction temperature rise typically leads to a shift in diode emission to longer and/or shorter wavelengths. According to one explanation, this wavelength shift is a direct result of the decrease in photonic junction bandgap with increasing temperature. Such wavelength shifts in the diode output beam can also be used to sense a change in refractive index and, thus, phase.

Figure 4:
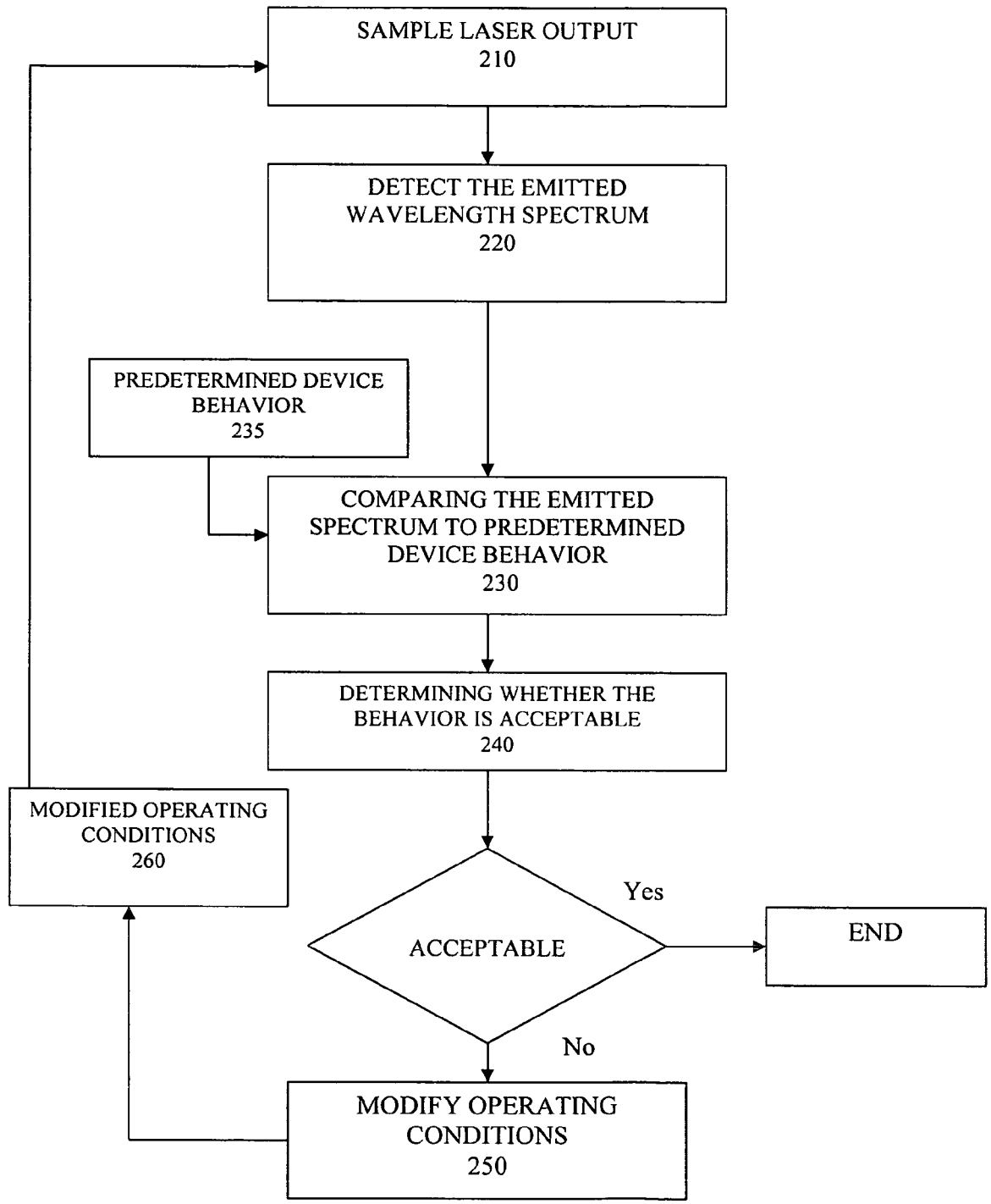
FIG. 4 is a flowchart representation of yet another detailed embodiment of the method of this invention.

FIG. 4 shows a flowchart representation 200 of another detailed embodiment of the method of this invention. Referring to FIG. 4, a small sample of the total laser diode output is obtained (step 210, FIG. 4) and the wavelengths of the laser diode output detected (step 220, FIG. 4). The wavelength is compared to a predetermined behavior (step 230, FIG. 4). If the behavior of the device terminal (or junction) voltage is not as indicated by the predetermined behavior, the operating conditions are changed in order to alter the detected relationship so that it is closer to the desired value (step 250, FIG. 4). This embodiment can include the additional steps of applying the modified input conditions (step 260, FIG. 4).

While the embodiments of the method of this invention shown in FIGS. 3a through 3c and in FIG. 4 are shown for a single device, the methods of this invention also apply to multiple devices. The extension of the method shown in FIGS. 3a, 3b, 3c and 4 to multiple devices is straightforward and indicated by comparing FIGS. 1 and 2.

Figure 5A:
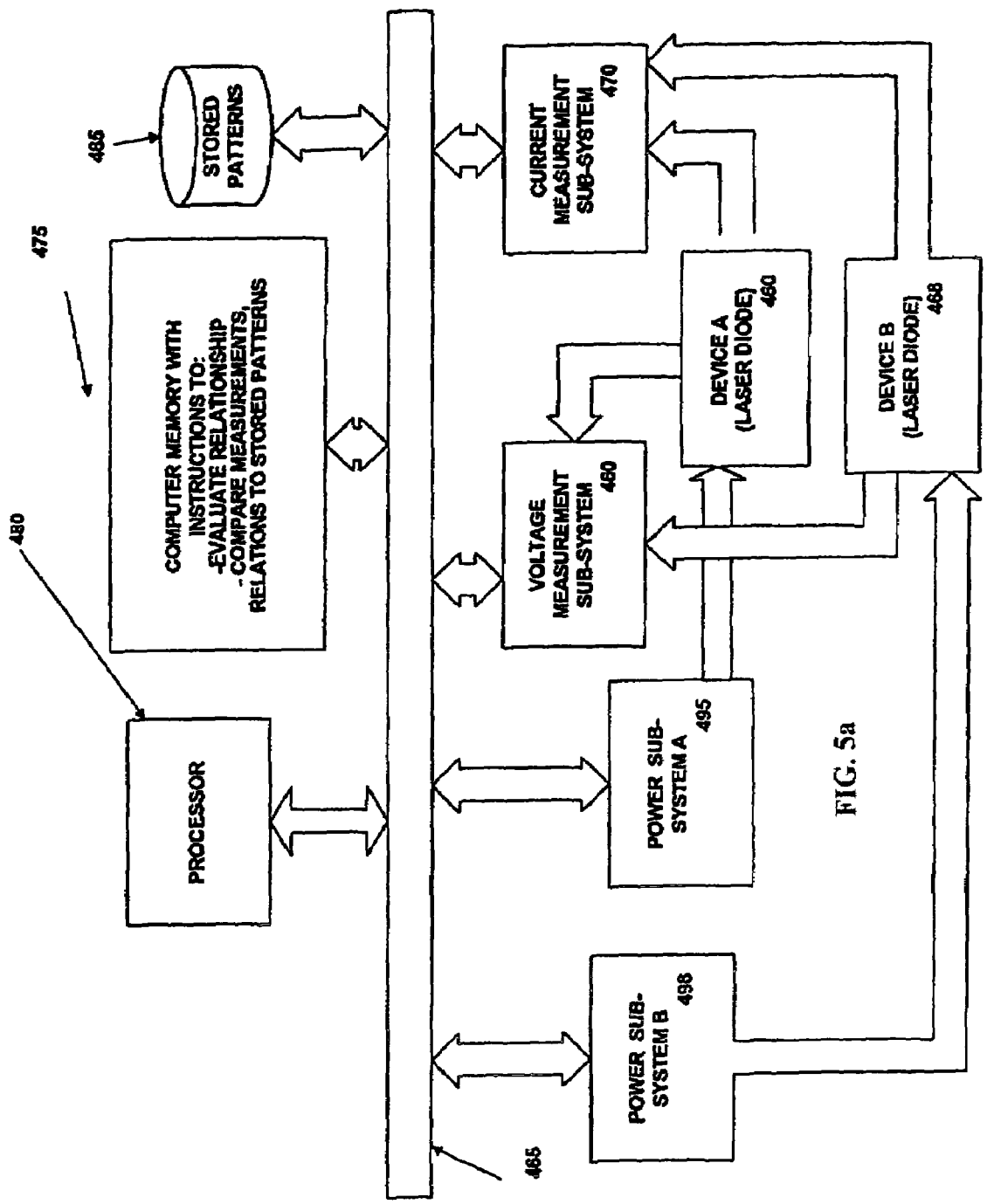
FIG. 5a is a schematic block diagram representation of one embodiment of the system of this invention.

The above-described methods of this invention can be implemented by the systems of this invention. FIG. 5a shows a schematic block diagram representation of an embodiment of a system 490 of this invention. Referring to FIG. 5a, a voltage measurement system 460 provides the laser diode voltage of either laser diode A 460 and/or laser diode B 468 at discrete time intervals to an operable connection 465, such as a computer bus. A current measurement system 470 provides the laser diode current at discrete time intervals to the operable connection 465. A computer readable memory 475 has a computer readable code embodied therein to instruct a processor 480 to evaluate a relationship between the laser diode voltage and the laser diode current and compare the relationship to the data from a stored pattern (or behavior) 485, and generate a power signal, to power sub-system A and/or power sub-system B, based on the comparison.

Figure 5B:
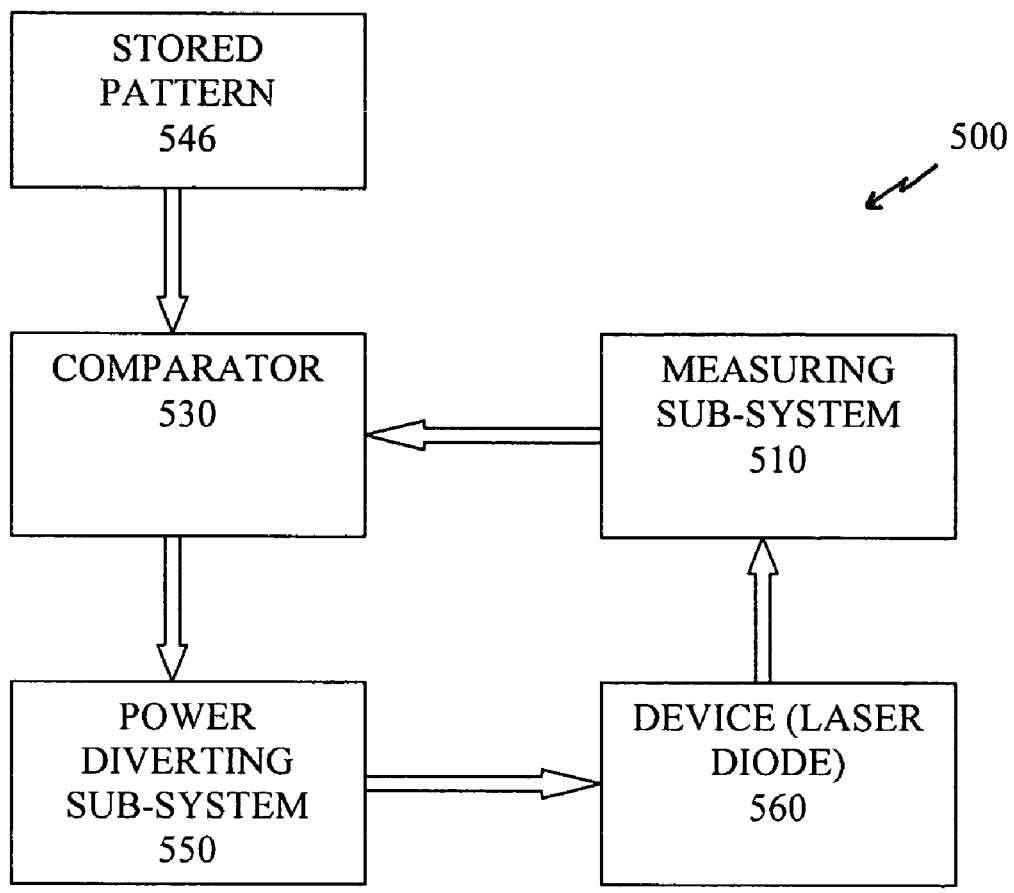
FIG. 5b is a schematic block diagram representation of another embodiment of the system of this invention.

FIG. 5b shows a schematic block diagram representation of another embodiment of a system 500 of this invention. Referring to FIG. 5b, a measurement system 510 provides the laser diode voltage, V(t) as a function of time, and/or the laser diode current, at discrete time intervals. In one embodiment, the laser diode voltage, V(t), and/or the laser diode current are analog signals. A reference signal 540 from a database of values is compared, by means of a comparator 530, to the measured values generated by the measurement system 510. The comparator 530 can be an analog system or a hybrid analog/digital system, which sends a signal, to power modifying system 550 based on the comparison.

Figure 6A:
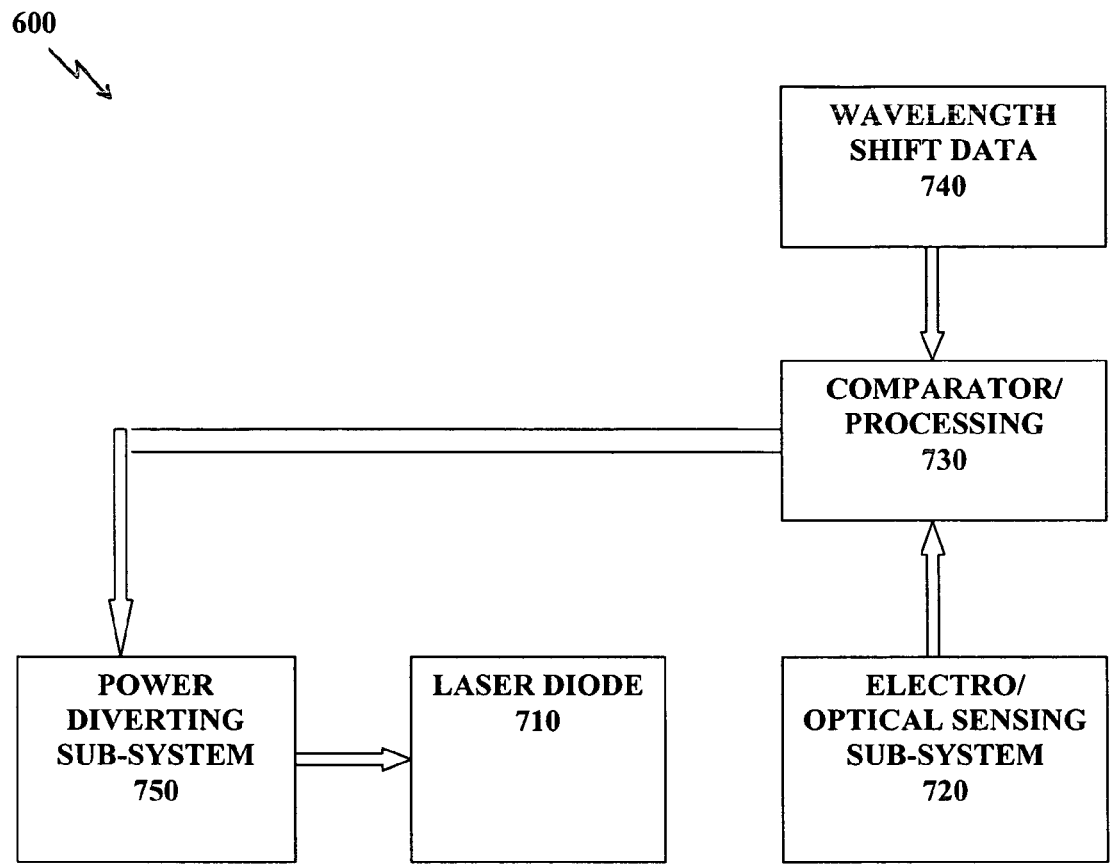
FIG. 6a is a schematic block diagram representation of yet another embodiment of the system of this invention.
Figure 7:
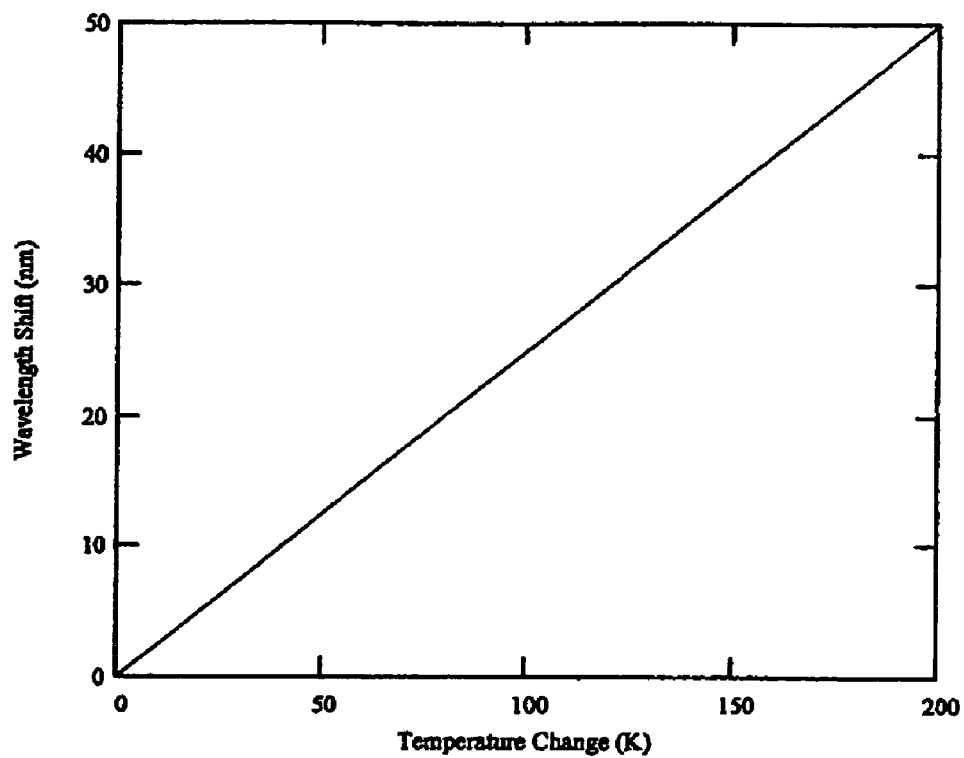
FIG. 7 is a schematic graphical representation of results of a calculation of wavelength shift associated with junction temperature.
Figure 19:
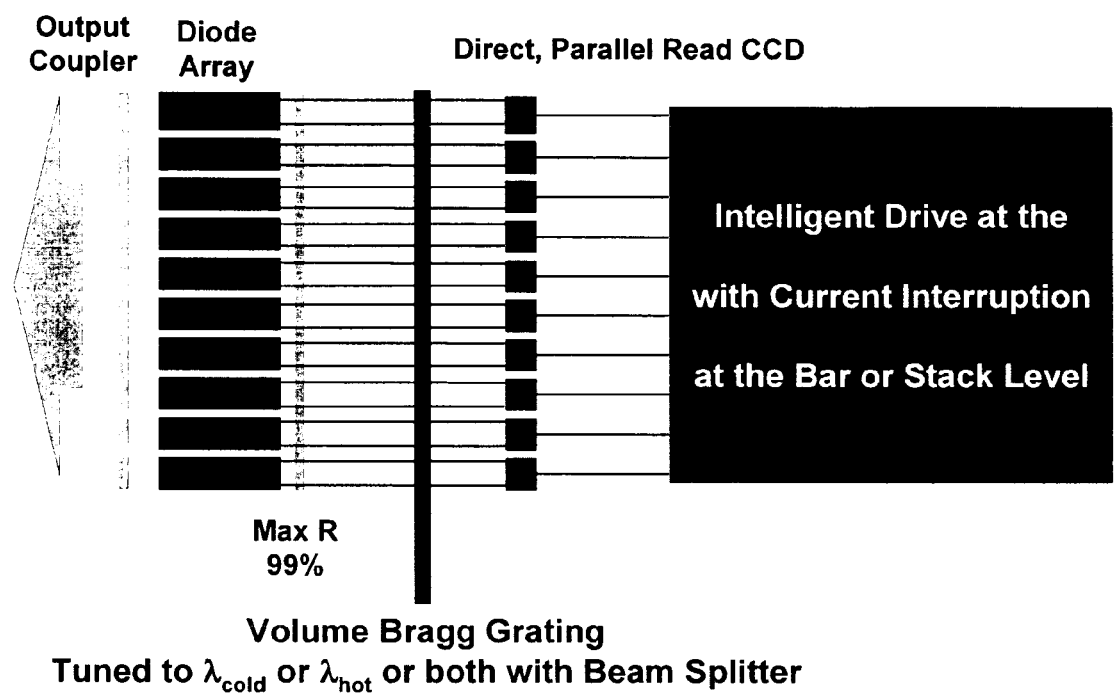
FIGS. 19-21 are schematic graphical representations of yet even further embodiments of the system of this invention.

FIG. 6a shows a schematic block diagram representation of yet another embodiment of a system 600 of this invention. Referring to FIG. 6a, an optical sensing device 720, such as, but not limited to, an optical system sampling a fraction of the total output of the laser diode (or junction device) or sensing the emission emanating from the back facet, senses the wavelengths of the laser diode output. One embodiment, but not limited to, of the optical system sampling a fraction of the output of the laser diode is an optical filter constructed with multi-layer dielectric coatings. Another embodiment, shown in FIG. 19, is a volume Bragg grating. The filter or grating as is would be designed to pass wavelengths longer or/and shorter than the wavelengths associated with normal stable operation of the laser diode. For example, in a diode designed to radiate at 808 nm at normal operating temperature, most of the radiation is contained in a band of approximately a 2 nm width about 808 nm. The wavelength shift associated with a junction temperature rise locally of $\Delta T$ is shown in FIG. 7. If it was desired in one embodiment to detect a temperature rise of 50° K, then the filter would be designed to pass wavelengths above 820.5 nm, and to reject or absorb wavelengths below 820.5 nm. A small fraction of the light from the diode would be sampled and sent to the filter. Any light with wavelength greater than a preselected value (820.5 nm in the example discussed above) then passes through the filter and is detected on a standard photodetector sensitive at wavelengths of the preselected value (820.5 nm in the example discussed above) and above.

Wavelength shift data (previously obtained) 740 is compared to the output of the optical sensing device 720 by a comparison/processing system 730. In one embodiment the wavelength shift data (previously obtained) 740 provides a predetermined threshold. When the signal from the optical system sampling a fraction of the output reaches a certain threshold, the detector signal indicates that the laser diode operation has departed from desired operation.

Figure 6B:
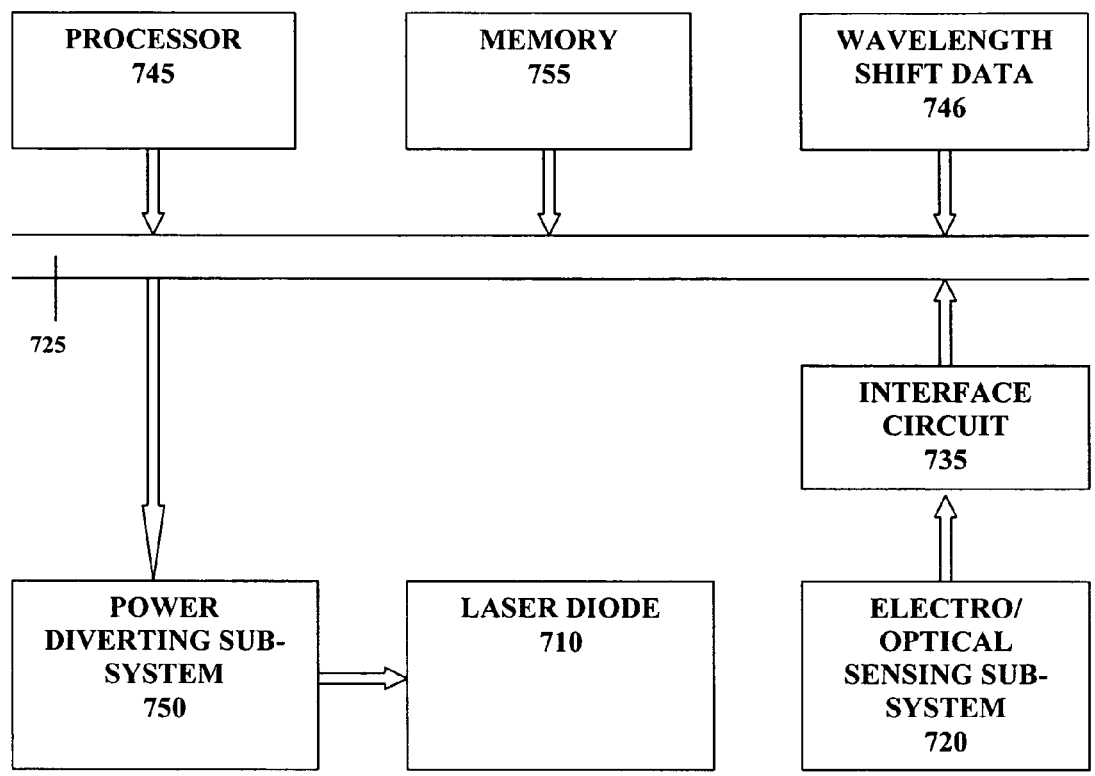

One embodiment of the comparison/processing system 730 is shown in FIG. 6b. Referring to FIG. 6b, the optical sensing device 720 provides laser diode wavelength data via an interface circuit 735 to an operable connection 725, such as a computer bus. A computer readable memory 755, also connected to the operable connection 725, has a computer readable code embodied therein to instruct a processor 745 to compare the measured value to the data from a stored pattern (or behavior), and generate a power modifying signal if the measurement significantly departs from the behavior. Upon receipt of the power modifying signal, the power system 750 modifies the power from laser diode 710.

In the embodiments of the system of this invention shown in FIGS. 5a-5b and 6a, 6b, the means for providing data are different depending on whether the comparator in the system operates as a mostly digital or mostly analog. For a mostly digital comparator, a pattern or value(s) is stored in a computer readable memory. A pattern could be stored as a set of instructions that cause a processor to calculate the pattern. The pattern or data is provided or retrieved by the processor. For a mostly analog comparator, a value is stored as a reference quantity (voltage, for example) and pattern is obtained from an analog circuit (or a digital implementation and a D/A circuit). The reference value or pattern signal is provided as an input to the mostly analog comparator.

The embodiments of the systems of this invention shown in FIGS. 5b, 6a and 6b depict only one laser diode. It should be noted that the systems of this invention shown in FIGS. 5b, 6a and 6b also apply to multiple laser diodes. The extension to multiple laser diodes can be obtained by comparison with FIG. 5a.

It should be noted that in the embodiments presented above, comparisons between measured and desired quantities are performed to within instrument or experimental error and therefore the comparison result is either substantially in agreement, or when an action results from the comparison, it is due to being substantially different (to the excess of error margins).

Exemplary, but not limited to, embodiments of the components of the above-described systems are shown in U.S. Patent Application Publication No. US 2003/0039280 A1, corresponding to U.S. patent application Ser. No. 10/165,195, which is incorporated by reference herein.

One embodiment, but not limited to, of a current indicator device that generates an output signal indicative of the current passing to the junction device comprises a transformer coupled to an input of a comparator to generate a voltage indicative of the current flowing to the junction device.

An embodiment, but not limited to, of a voltage monitoring device that generates an output signal indicative of the voltage across the junction device comprises a comparator configured to monitor the voltage across a laser diode source, such as 460 in FIG. 5*a* or 560 in FIG. 5*b*. As described below, comparator 1036 becomes conductive in the event that the voltage across the laser diode source drops below a threshold voltage. The comparator may be any device having a conductivity that depends on a voltage input. For example, the comparator may be a transistor. In one embodiment, the comparator is a bipolar transistor having a switching rate of 1000 MHz. The comparator may, in some embodiments, be combination of devices such as an operational amplifier in combination with a transistor, where the operational amplifier monitors the voltage across the laser diode source and produces an output to the transistor, which becomes conductive upon receiving the operational amplifier output.

A signal indicative of the voltage and a signal indicative of the current may be used to produce a signal indicative of a relationship between the voltage and the current, such as the impedance of a laser diode.

It should be noted that although in some of the embodiments presented above the methods and systems of this invention are described in terms of the device terminal voltage, in some embodiments the methods and systems can also be implemented in terms of the device junction voltage. The term "device voltage" as used hereinafter refers to, but not limited to, device terminal voltage (also called terminal voltage) or device junction voltage (also called junction voltage).

As disclosed hereinabove, the method and system for the detection of anomalies in diode junction behavior disclosed in U.S. patent application Ser. No. 10/922,753, which is incorporated by reference herein, or/and other design techniques (such as, but not limited to, applying waveguide concepts in the laser design) are applied to substantially ameliorate the effects of anomalous behavior, such as filamentation, thereby substantially eliminating changes in phase. Then, the methods disclosed above are utilized to substantially control the phase of the emitted electromagnetic radiation.

If two a more lasers are substantially coherently combined or are substantially phase locked, the onset of anomalous behavior, such as filamentation, in one or more of the lasers will disrupt the substantial equality of the phases or the phase lock. The methods and systems of U.S. patent application Ser. No. 10/922,753, can be used to sense the onset of anomalous behavior, such as filamentation, and to substantially divert the power away from the laser experiencing the onset of anomalous behavior, such as filamentation. In this manner, the substantial equality of the phases or the phase lock can be maintained since the laser experiencing the onset of anomalous behavior, such as filamentation, is temporarily removed from the system (since the power is substantially diverted away from that laser) while the condition of anomalous behavior, such as filamentation, exists in that laser.

It should be noted that the systems of this invention (as well as the systems disclosed in U.S. patent application Ser. No. 10/922,753) can be partially (or in some cases completely) integrated onto the laser diode bar. The integrated circuit/laser diode on-a-chip provides for the control of the current and/or power to each emitter, thereby controlling the phase. Controlling the current also controls the changes due to carrier effects.

Figure 16:
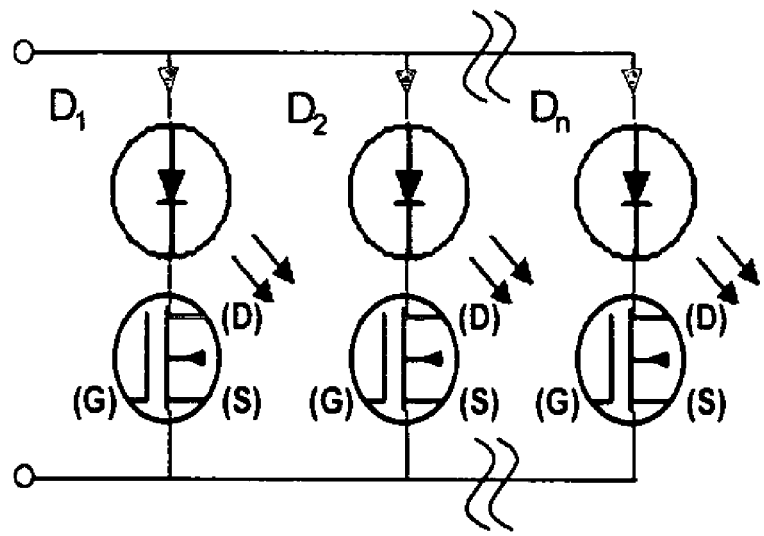
FIG. 16 is a schematic block diagram representation of another embodiment of the laser system incorporating the protection system of this invention.

As shown in FIG. 16, by monitoring voltage (and/or current) variations and controlling current in each emitter, it is possible to protect individual emitters by the methods and systems of this invention, and still allow the overall diode bar to remain on and producing optical power. Developing miniaturized emitter electronics and integrating it into the diode bar can be achieved by conventional semiconductor fabrication techniques.

Since the Index change due to temperature is positive while the change due to carrier density is negative, in one embodiment, the diode lasers are designed such that these effects compensate each other.

It should be noted that the methods and systems of this invention can be practiced in conjunction with other methods and systems for combining laser diode beams. Methods for coherently combining laser diode beams, such as those detailed in T. Y. Fan, *Laser Beam Combining in High Power, High Radiance Sources*, IEEE J. of Selected Topics in Quantum Electronics, Vol. 11, No. 3, May/June 2005, pp. 567-577, incorporated by reference herein, are within the scope of this invention.

External cavities have been used in conjunction with laser arrays in order to coherently couple the individual lasers in the array, that is, form a phased array (see, for example, C J Corcoran and K A Pasch, Modal analysis of a self-Fourier laser Cavity, J. Opt. A: Pure Appl. Opt. 7 (2005) L1-L7 and C J Corcoran and K A Pasch, Self-Fourier functions and coherent laser combination, J. Phys. A: Math. Gen. 37 (2004) L461-L469, both which are incorporated by reference herein).

Figure 8:
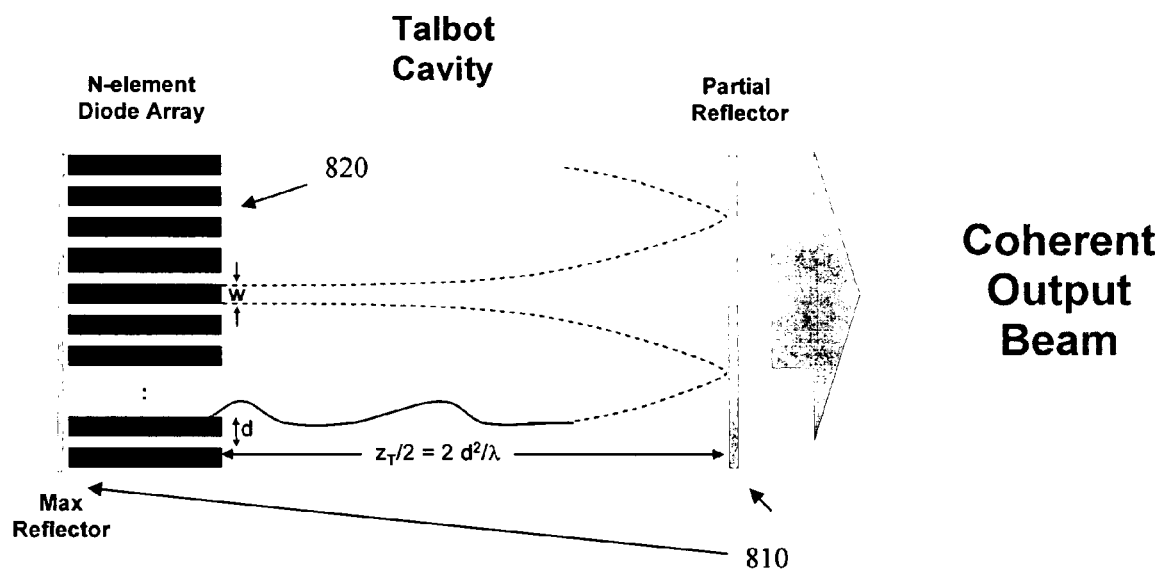
FIG. 8 is a schematic representation of a Talbot cavity.

One embodiment of a phased array is a Talbot resonator (see, for example, Uwe Braurch, Peter Looosen, and Hans Opower, High-Power Diode Lasers for Direct Applications, in High-Power Diode Lasers, R. Diehl, Editor, Springer (2000), which is incorporated by reference herein) shown schematically in FIG. 8. A Talbot cavity 810 (an embodiment of a combining component) is a two-mirror, planar optical resonator cavity in which the max reflector mirror and the output coupler are spaced at the precise discrete distances that re-images the diode array 820 on the return of the reflected light toward the front surface of the diode array 820 enclosed in the resonator (see FIG. 8) It should be noted that although results are presented below for a Talbot cavity, other external cavity embodiments forming a phased array are within the scope of this invention. In an embodiment of this invention, connected to each diode of the diode array 820 is a sensing sub-system (a measurement sub-system such as shown in FIGS. 5*a*, 5*b*, 6*a*, 6*b*) capable of providing a sensing output indicative of phase behavior, means for providing predetermined indicator behavior, a comparator subsystem capable of comparing said sensing output indicative of phase behavior to the predetermined indicator behavior, and a power modifying subsystem capable of modifying input power to a laser diode from the diode array 820 if an output of the comparator subsystem indicates that comparison results are not within a predetermined range. In some embodiments, such as that shown in FIG. 11 and FIG. 13, the sensing sub-system operates on the entire array output.

Figure 9:
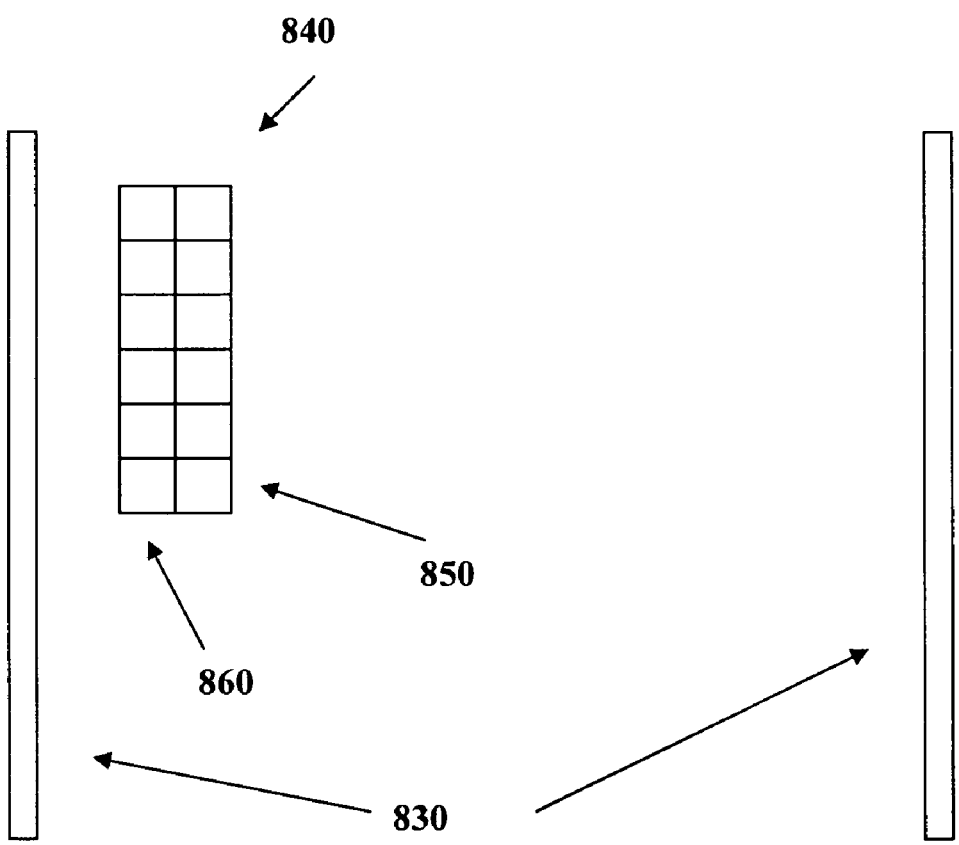
FIG. 9 is a schematic graphical representation of results of a calculation of wavelength shift associated with junction temperature.

An embodiment of the system of this invention, shown in FIG. 9, includes a combining component 830 and a number of emitting sub-systems 840. Each emitting sub-system has a laser diode 850 and a control sub-system 860 (see FIG. 5*b* for an embodiment) including a sensing sub-system (a measurement sub-system such as shown in FIGS. 5*a*, 5*b*, 6*a*, 6*b*)

capable of providing a sensing output indicative of phase behavior, means for providing predetermined indicator behavior, a comparator subsystem capable of comparing said sensing output indicative of phase behavior to the predetermined indicator behavior, and a power modifying subsystem capable of modifying input power to a laser diode from the diode array 820 if an output of the comparator subsystem indicates that comparison results are not within a predetermined range.

Some components of a conventional Talbot Cavity are detailed below:

1. Talbot cavities rely on diffractive spreading to phase adjacent diodes in the array, with phase information spreading across the array until all diodes are locked in phase
2. The Talbot cavity contains the diode array, whose facets are AR coated, "front" and "back"
3. The Talbot cavity is placed around the diode array with the max reflecting "back" mirror very close to the "back" facets of the diodes in the array. The other mirror, the output coupler, is spaced at the half the Talbot distance, $z_T/2$, from the "front" surface of the diode array.
4. In this geometry, near-diffraction-limited diodes are required so that high fill factors can be achieved with lens-let arrays while preserving high efficiency. The Talbot cavity acts as a highly selective spatial filter, with the cavity length selected so that the individual emitters are re-imaged on each pass through the cavity—for diodes with large divergence ($M^2>10$ as is typical for edge emitters), there is significant loss on each pass since for such high divergence diodes, most of the optical power does not re-image.
5. High fill factor means that individual diodes will couple only to their very nearest neighbors (minimum diffractive spread) and will result in a long mode build up time (>10 nanoseconds), which will allow one time to remove rogue diodes from the phased array—see next chart
6. In theory, the Talbot cavity will allow the coherent combination of all the diodes in the array.

The method and systems of this invention can prevent failure of phased arrays, the Talbot cavity being one embodiment. The embodiment of the method of this invention used to prevent failure of phased arrays in Talbot cavities includes the following steps:

Using filamentation-resistant, single-transverse-mode, near-diffraction-limited laser diodes (or, alternatively, using diodes of this invention whose phase can be controlled by the methods of this invention;

using a lenslet arrays to achieve high fill factors within the Talbot cavity to insure long coherent mode build up times to allow time to remove power from "rogue" diodes before they can disrupt phasing using the methods and systems of this invention (such as, but not limited to, substantially precise, integrated, low inductance, fast CMOS, in one embodiment, fault-mode-protection circuits and current control) to drive single emitters with sufficient bandwidth to sense anomalous behavior, such as filamentation and current hogging, in single emitters and to remove power from "rogue" diodes (diodes exhibiting anomalous behavior, such as filamentation and current hogging) rapidly (for example, but not limited to, on a nanosecond time scale)—before these diodes can destroy the phasing of the array Relying on the coherent fields in the Talbot cavity to rephase the "rogue" diodes upon re-entry into the phased array (after sufficient recovery time, in one embodiment).

In one embodiment, these systems are integrated on a chip and phase array of high power diodes.

The methods and systems disclosed hereinabove can be applied to other phased array embodiments. Anomalous behavior, such as filamentation and current hogging instabilities, prevent phasing of laser diode arrays. At high power, the high injected current in each emitter produces large charge carrier densities. The index-of-refraction associated with these charge carriers leads to a phase shift such that the optical beam traverses the laser cavity will be significantly shifted. At high power, anomalous behaviors, such as filamentation instabilities, are prevalent within conventional broad stripe single emitters. These instabilities create filaments of injected current and therefore filaments of charge carriers, which lead to different phase shifts at different points along the emitter stripe. These filaments can form on, but are not limited to, nanosecond time scales, and prevent phasing of the light within a high power diode emitter. These anomalous behaviors, such as filamentation instabilities, are also responsible for the poor beam quality seen in the beams from laser diodes.

Current hogging refers to the unequal sharing of current among various individual emitters in a laser diode bar. Current hogging instabilities prevent phasing among various emitters in a laser diode bar.

One consideration in the method of preventing anomalous behavior, such as filamentation, within a single emitter is using new single mode diode architectures such as the slab-coupled optical waveguide laser concept (for example, embodiments that confine the optical mode to a small, filamentation-resistant waveguide.) (This consideration can be combined with some of the other steps described hereinabove.) This mode is then coupled to the high gain quantum well region only weakly by placing the quantum wells in the far wing of the mode. These diodes are designed so that only a single dominant mode within the optical waveguide experiences gain, with all other higher modes experiencing loss.

Current hogging instabilities may be substantially reduced by driving each of the individual diodes in the bar from its own electrical power supply which controls current with adequate precision.

By controlling both filamentation and current hogging, arrays of laser diodes, such as, but not limited to, kilowatt-level arrays of 1 watt laser diodes, can be coherently phased. Such phasing can be accomplished, in one embodiment, in a Talbot cavity which re-images the optical mode on each round trip through the cavity. The coherent output beam from the Talbot cavity can be phase locked to a reference beam by driving a few of the single emitters as amplifiers from a single reference oscillator. The phase information passes to the nearest neighbors of the phased amplifiers until the entire array is phase-locked.

However, as previously stated, to make phasing of such large arrays robust, it is necessary to shut off emitters which can filament despite the filamentation-resistant single emitter design. Incorrect phase information from such "rogue" emitters de-phases the array. Using the methods and systems of this invention, these rogue emitters can be sensed and current to these emitters turned off on a time scale substantially short compared to the mode build up time in the Talbot cavity. This can be accomplished, in one embodiment, as detailed above, by building a system into each of the individual emitter power supplies which senses anomalous behavior, such as filamentation, and then removes drive current to that emitter faster than the mode build-up time. These "rogue" emitters can then be turned back on a few thermal cooling times later when the effects of anomalous behavior, such as filamentation, have dissipated. When current is re-applied to the rogue emitter, the array provides in-phase photons to phase the diode output.

Figure 10:
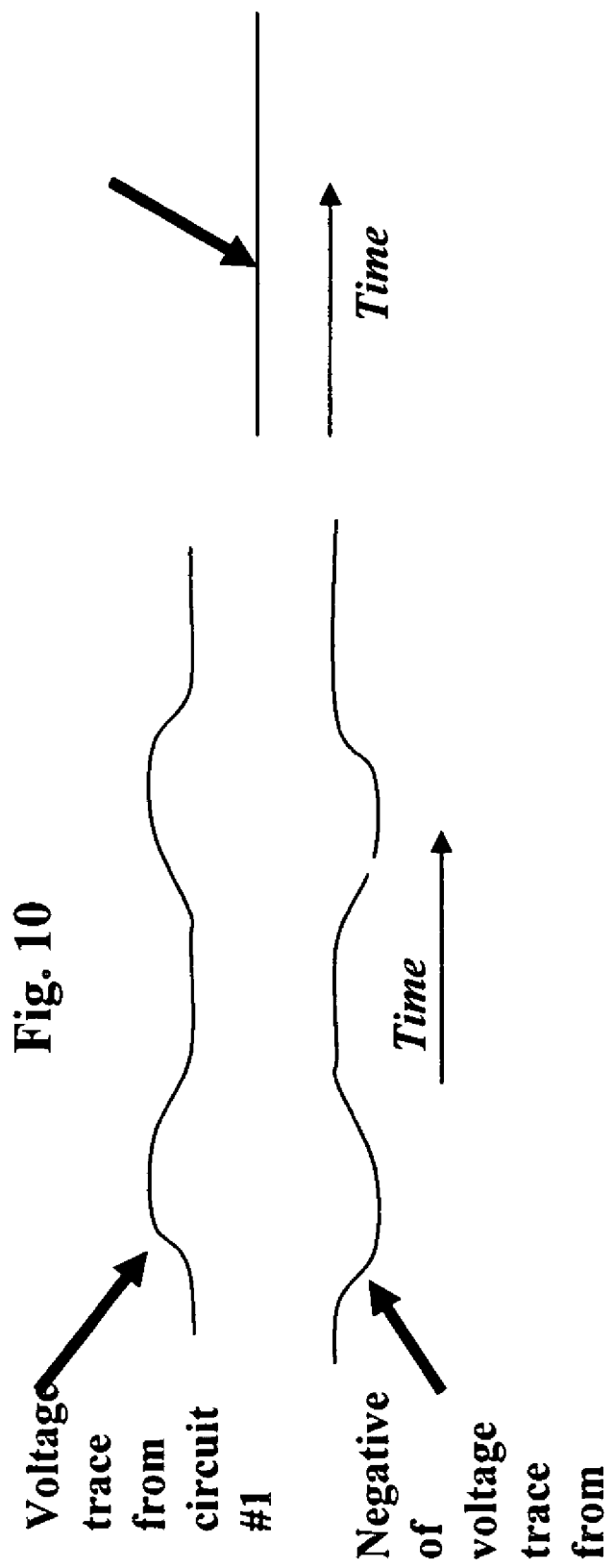
FIG. 10 is a schematic representation of an application of the method of this invention.

In order to observe the voltage transients in the system and methods of this invention, it is desirable to have a very low noise power supply. Noise in the power supply may also trigger filament instabilities, which increases the desirability of low noise drivers. In prevailing power supply designs, there are switching circuits and other components that lead to systematic noise. These sources of systematic noise can be reduced by either use of software or hardware. Software methods for reducing the noise include, but are not limited to, recording the V/I characteristics and, from analysing the trace, determining the repeatability of the systematic noise. Based on this analysis, a program is written that automatically substracts out the reproducible or systematic noise. Another embodiment of the method of this invention for reducing systematic noise includes designing a circuit with as close to identical circuit elements as possible. Then, by inverting the repeatable and systematic noise in one circuit and adding it to the other circuit one would substantially reduce the noise in the supply. (See FIG. 10). In a further embodiment of the method of this invention, the waveform is shifted by substantially one half period and added it to itself. This can be accomplished by software or by hardware (for example, but not limited to, installing a transmission line with a length of half a period). In the preceding example, utilizing non-linear magnetics the length of the line can be adjusted and upgraded every period.

Figure 11:
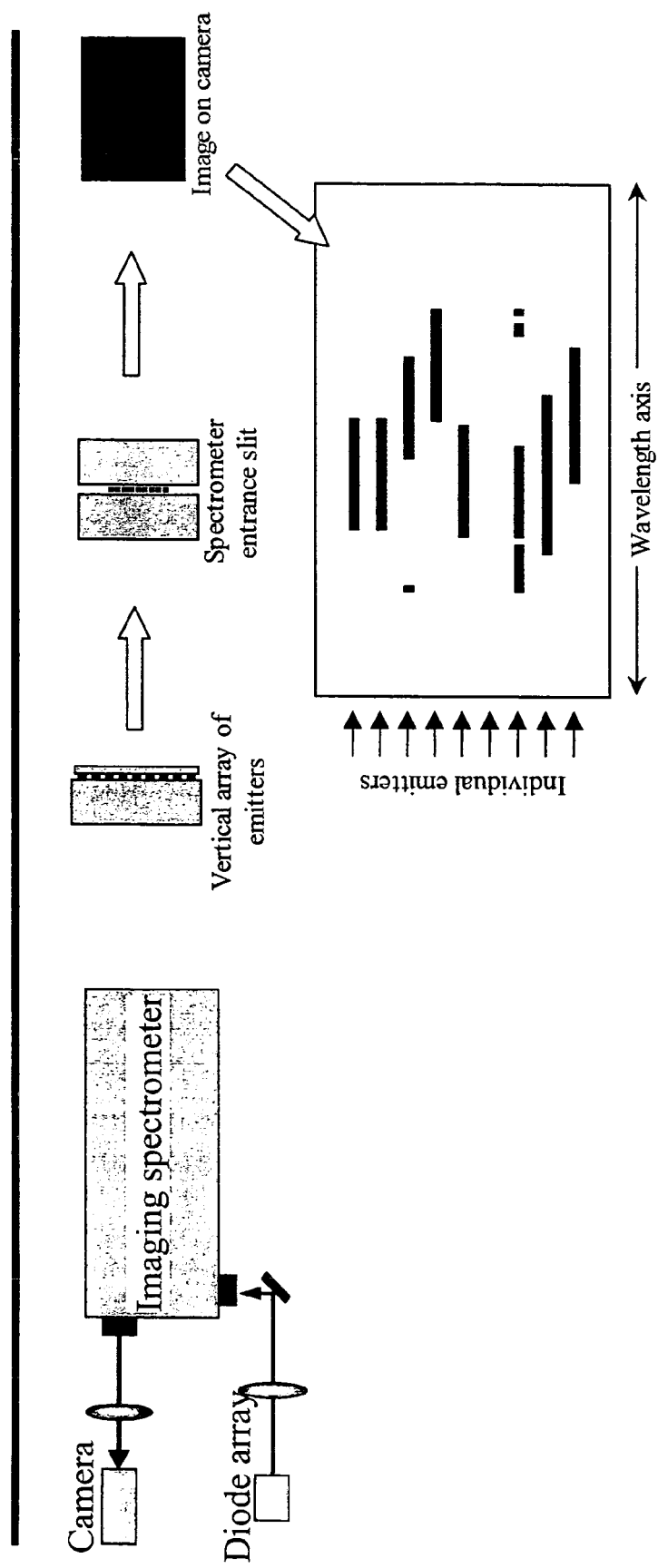
FIG. 11 is a schematic representation of a further embodiment of the system of this invention.
Figure 12:
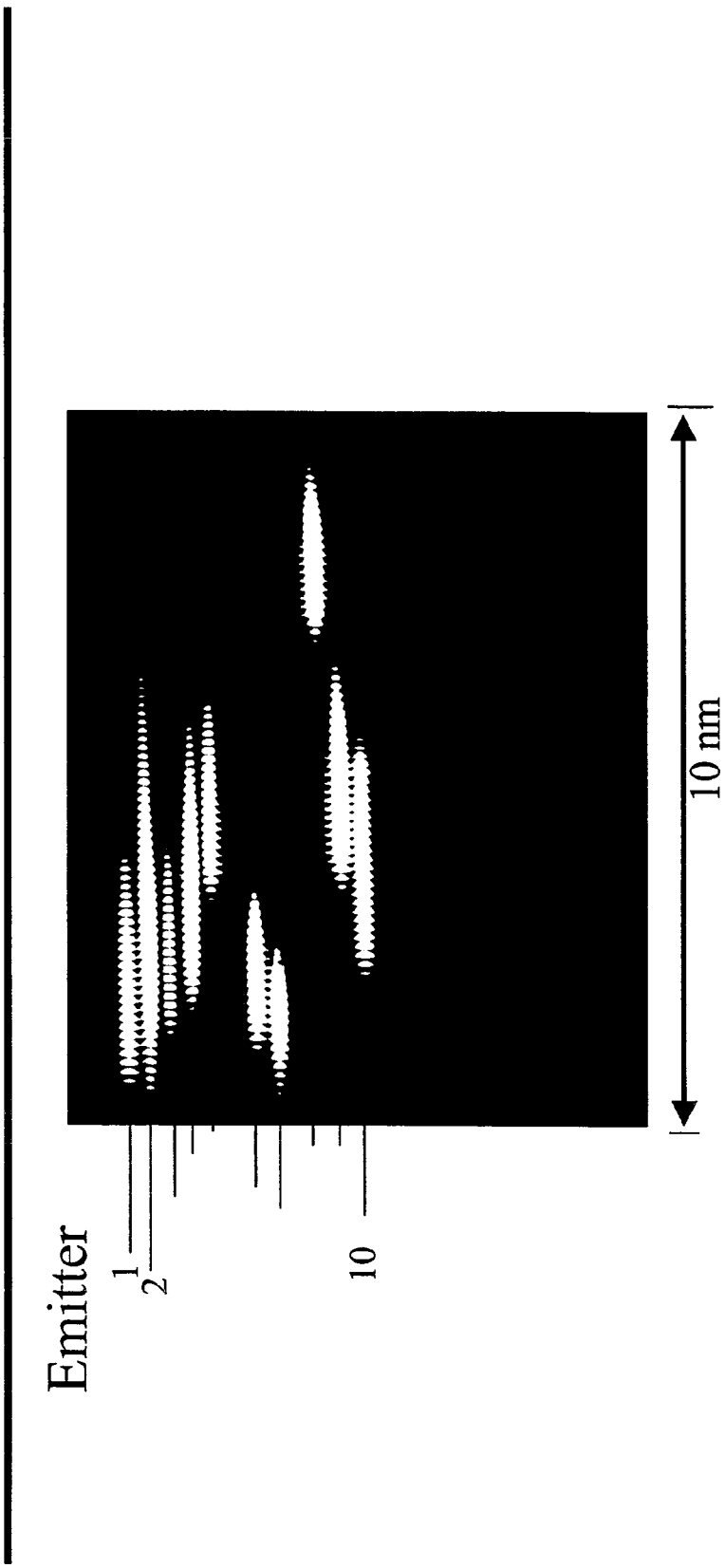
FIG. 12 is a schematic graphical representation of results from the embodiment of FIG. 11.
Figure 13:
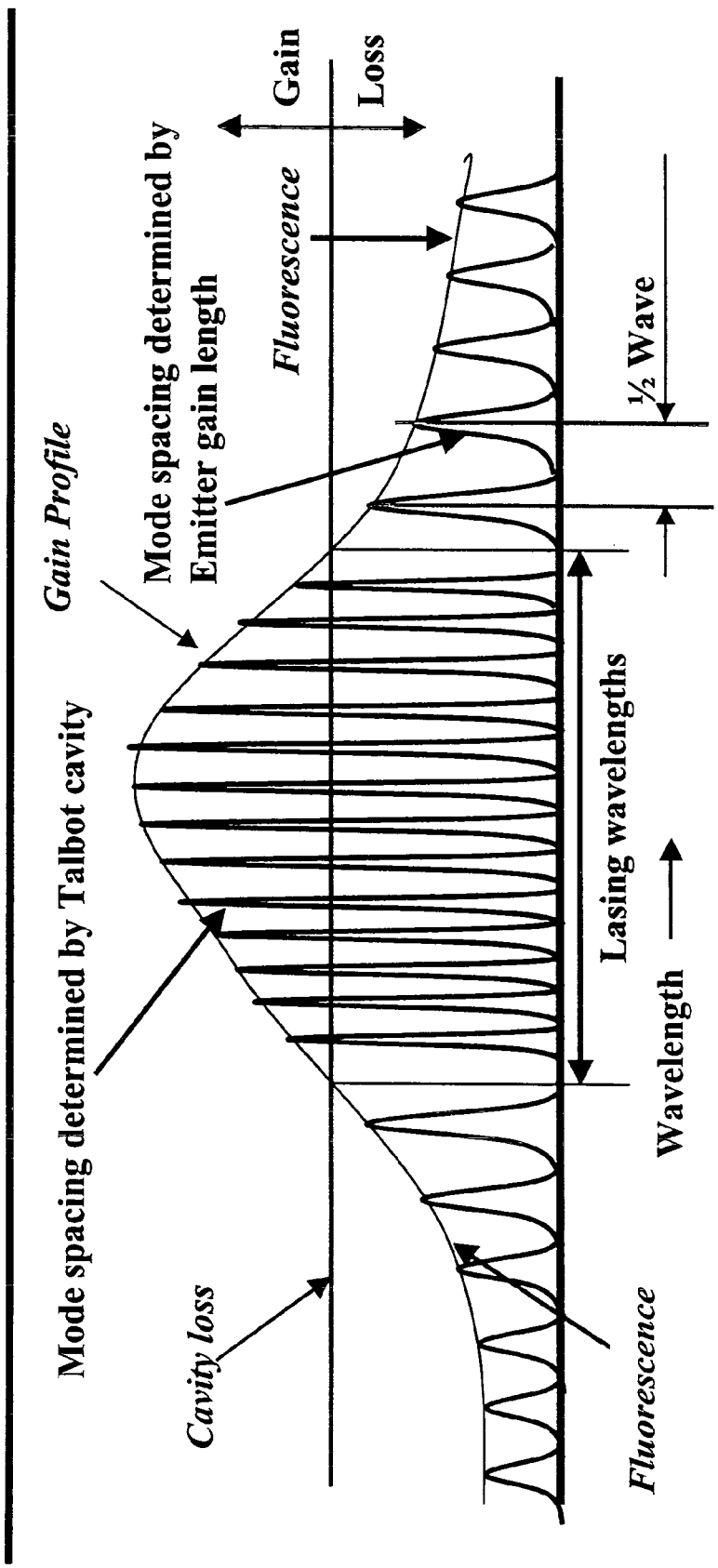
FIG. 13 is a schematic graphical representation of mode spacing for an embodiment of this invention.
Figure 14:
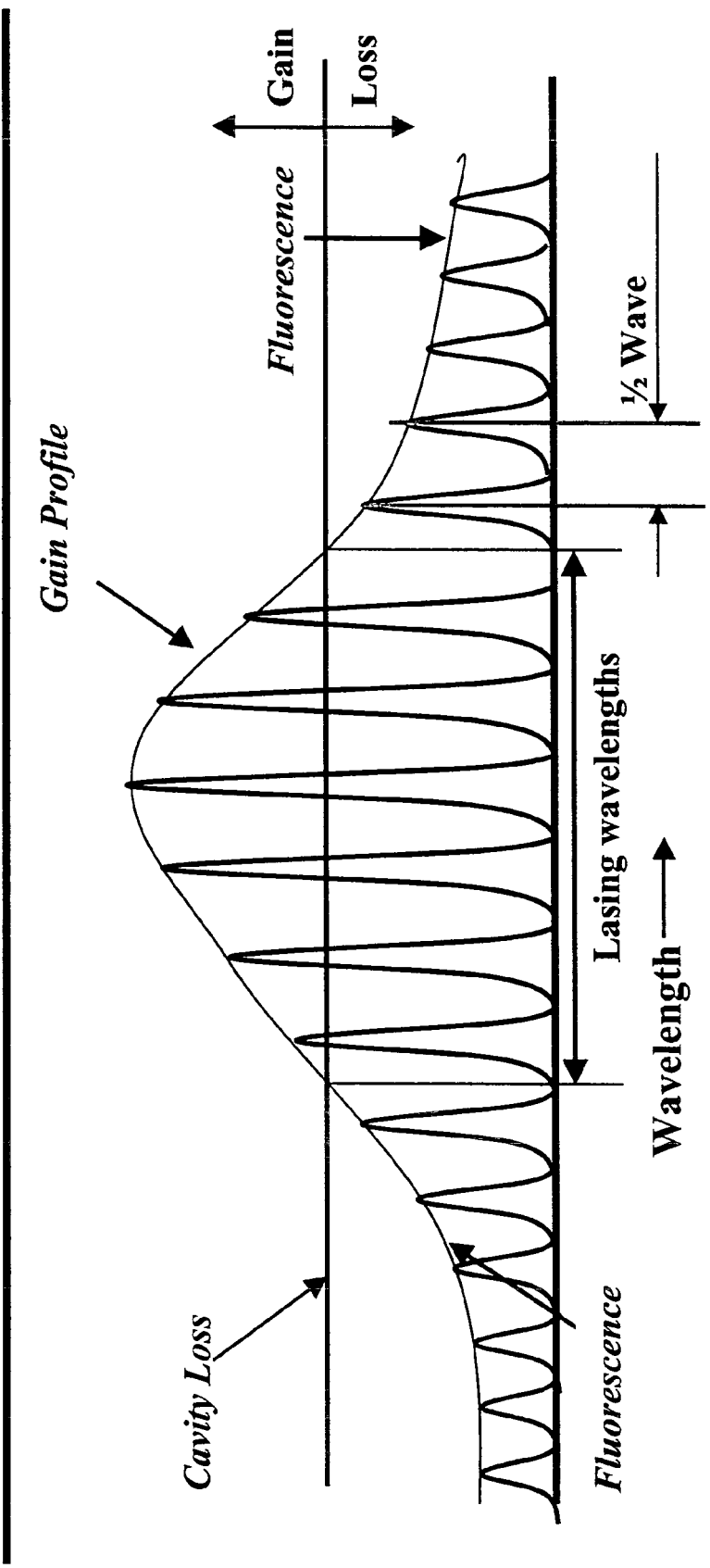
FIG. 14 is a schematic graphical representation of mode spacing for another embodiment of this invention.
Figure 15:
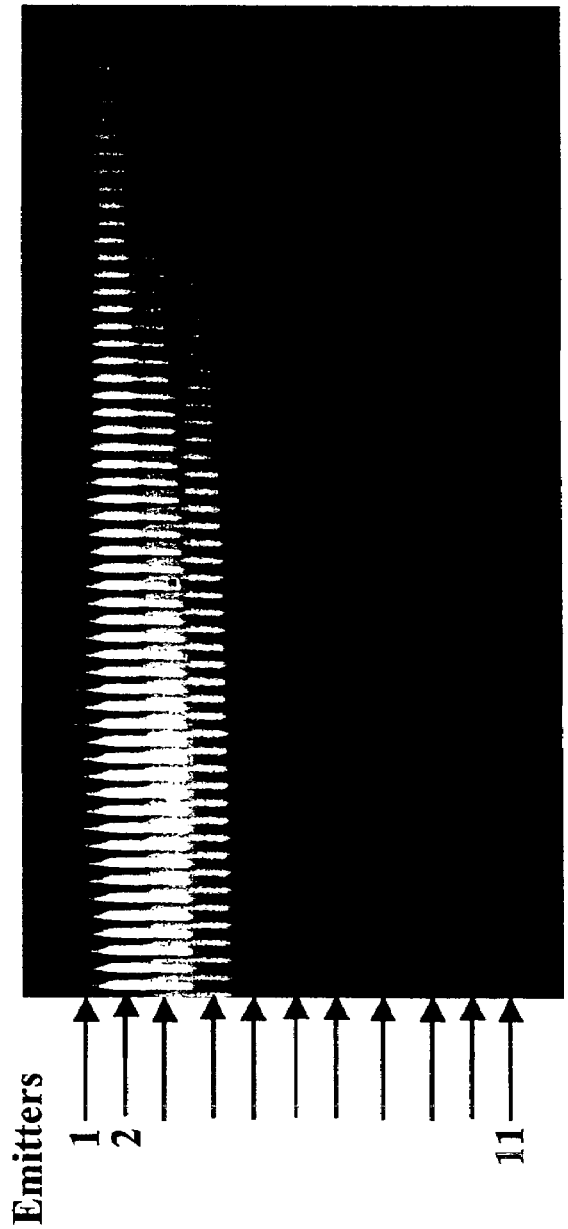
FIG. 15 is a schematic graphical representation of more results from the embodiment of FIG. 11.

In addition to methods and systems for removing the faulty, or the rogue diode (emitter) that current hoggs by detecting voltage transients, another embodiment of the methods and systems of this invention includes an optical method for detecting current hogging by rogue or faulty emitters. As seen in the figures below, an optical diagnostic can be used for observing the spectra of the individual emitters in a diode array. FIG. 11 provides an embodiment of the layout of the experimental apparatus. Upon inspection of the lasing spectra, in this case around 1 μm, a fine mode structure is observed. The spacing of these modes is substantially half a wave (see FIG. 12). In order to preserve the phase of the combined diode array, it will be necessary to detect small phase changes in the individual emitters to detect the rogue emitter and to temporarily remove power from it. To measure such a small phase change, one should be capable of detecting a fraction of or an entire fringe shift, which is very possible. However, as shown in FIG. 13, it will not be possible to detect these phase changes by observing the lasers spectra. Instead, one may record and observe the fluorescence spectra for individual emitters that are not phase locked. These spectra will have the same spacing as the laser spectra when the array is not phase locked (see FIG. 14). However when the array is phase locked, the laser spectra will have the a mode spacing that is representative of the cavity length of the Talbot cavity (see FIG. 13) and the spectra from all the emitters will be approximately the same. The fluorescence may however have a mode spacing that is representative of the emitter length (see FIG. 13). As shown in FIG. 15, the fluorescence spectra will have a mode spacing determined by the emitter gain length. By tuning the spectrometer to observe and record the fluorescence spectra, phase changes in the individual emitters in the diode array can be monitored. Phase changes due to carrier density changes can be temporally separated from phase changes resulting from temperature changes. Tuning the spectrometer to the fluorescence band can also avoid any saturation or blinding effects resulting from the far more intense laser radiation. Thus, this embodiment of this invention also includes optically observing the fluorescence spectra of a phase locked diode array and thereby rapidly detecting the rogue diode whose phase has changed by current hogging and to rapidly (but temporarily) remove electrical power from it.

Figure 17:
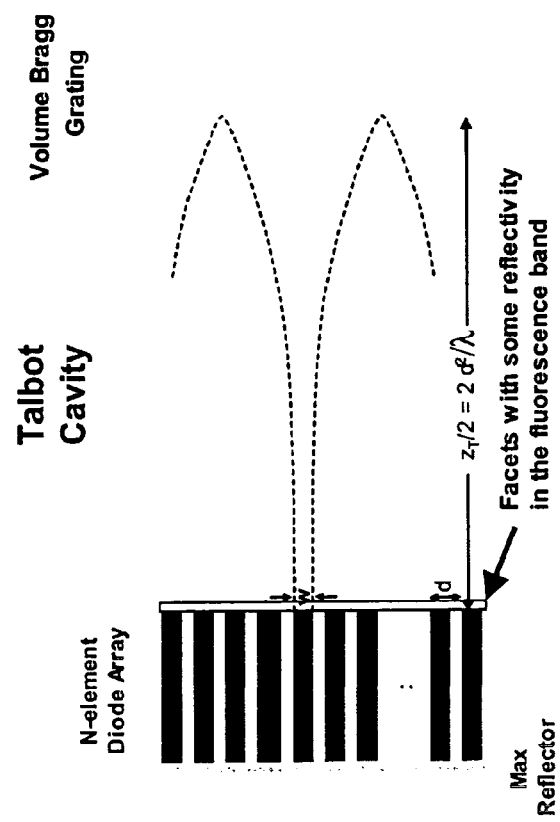
FIG. 17 a schematic graphical representation of yet a further embodiment of the system of this invention.
Figure 18:
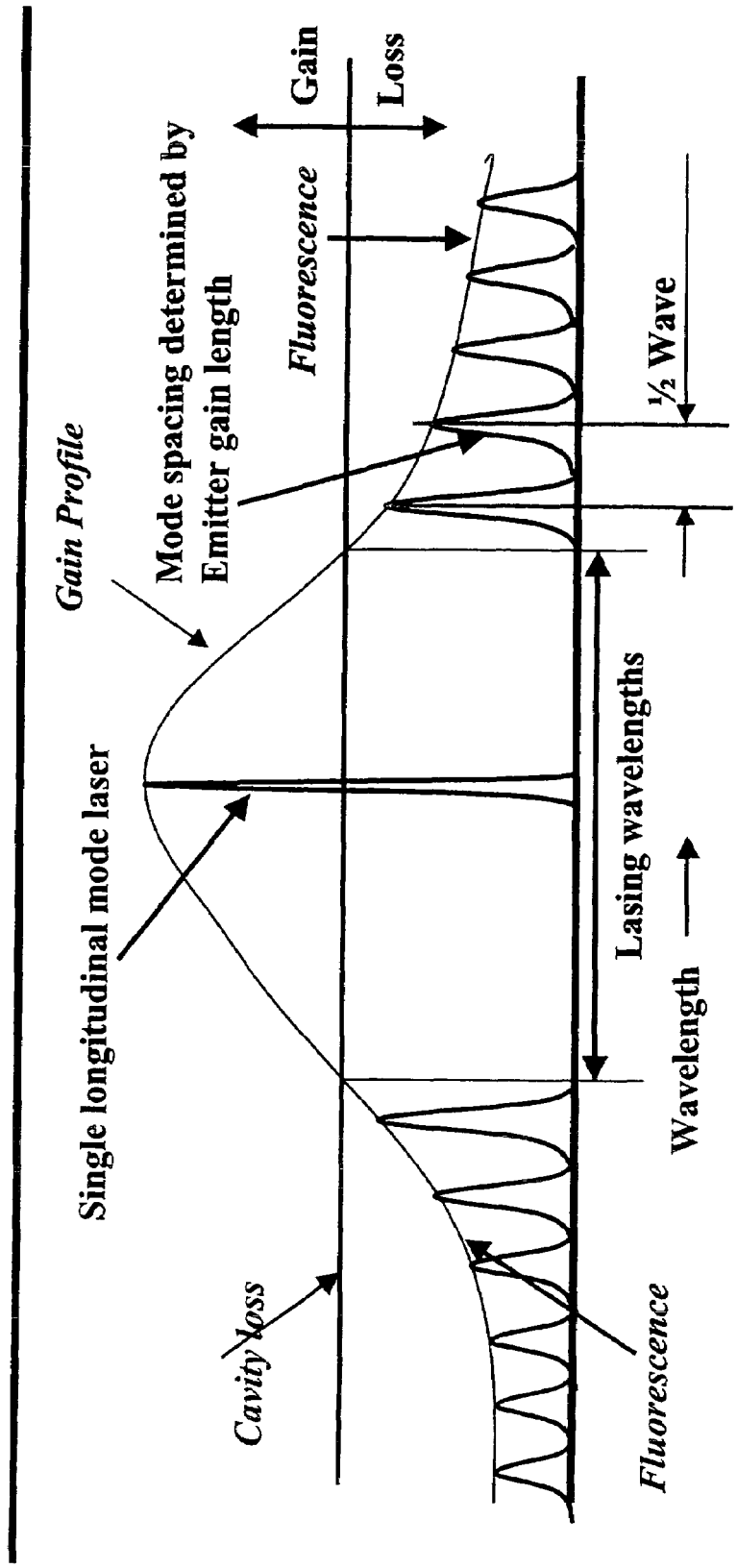
FIG. 18 is a schematic graphical representation of mode spacing for an embodiment of this invention corresponding to FIG. 17.

As shown in FIG. 17, a Bragg volumetric grating may be used, in one embodiment, as an output coupler. This will allow a narrower laser line, possibly as narrow as one longitudinal mode. Such a Talbot cavity allows, in one embodiment, for a lager wavelength separation between the laser radiation and fluorescence (around 50 Å). This will allow one to have facets that can be coated to substantially reflect fluorescence but not the laser radiation (see FIG. 18).

In using the embodiment of optical diagnostic described herein above, one consideration is to insure that the laser emission, which will be considerably brighter than the fluorescence, will not adversely interfere with the fluorescence. There are some considerations to ensure the desired result, including, but not limited to:

1. Since the laser radiation will be tens of Å from the fluorescence, the spectrometer slit will block out the laser beam
2. Further attenuation can be achieved by viewing the fluorescence off-axis (from the laser radiation)
3. A double spectrometer could be used to further attenuate the laser radiation Electrical noise from the driver may induce filament instabilities which could be another reason to reduce the electrical noise as much as possible. In the embodiments in which, at the single emitter level, the electronics are located on a chip (in some embodiments, the chip includes the single emitter) to protect each individual emitter, then one of the method of protecting the emitter from filament instabilities, and correspondingly increase its lifetime and preserve its optical quality, would be to monitor the current (as in FIG. 3c). When current hogging occurs, the current to the emitter will increase. An embodiment of this invention, that monitors current, will observe such an instability and be able to protect the diode and preserve the beam quality by reducing or diverting electrical power from the emitter in question.

Figure 20:
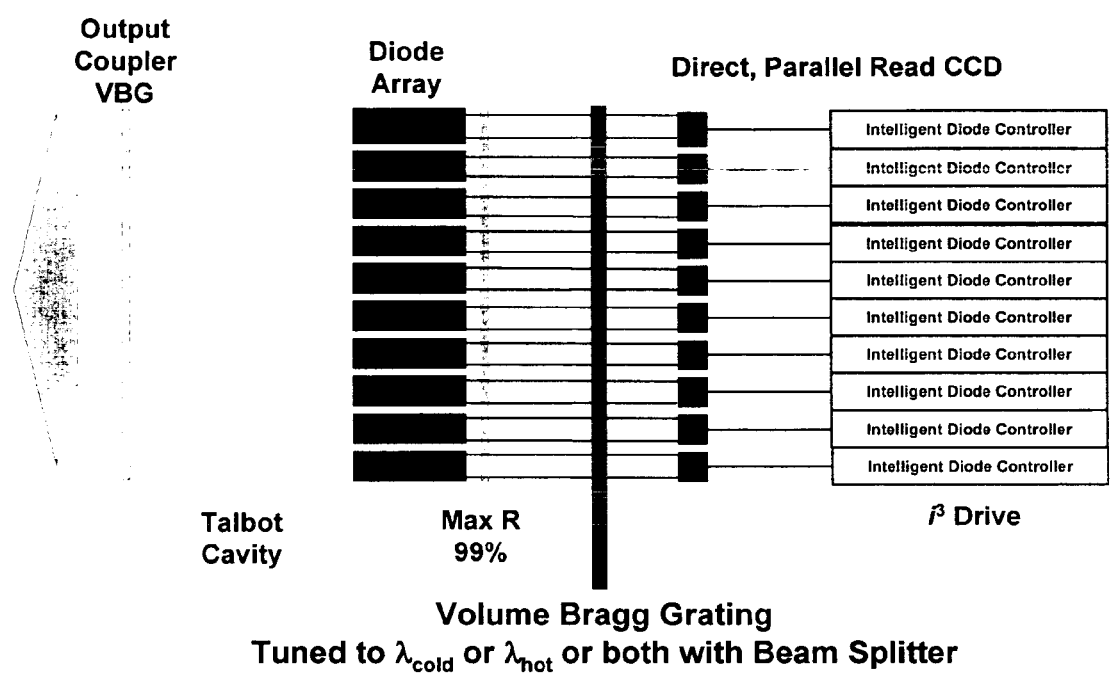

Referring to FIGS. 19 and 20, when anomalous behavior, such as filamentation, occurs the laser spectral content will be both red and blue shifted. According to one explanation, this spectral shifting occurs because the region that has the filament will be hotter than the rest of the gain medium while the remainder is cooler. The spectrum from the hotter region will be red shifted, as the band gap decreases with temperature, while the spectral content from the remainder of the gain medium will be cooler and the spectral content will be blue shifted. As in the embodiment shown in FIG. 19 and FIG. 20, one can observe the radiation, for example, from the rear of the individual emitters. The radiation emanating from laser diodes propagate through a narrow volume Bragg grating before being detected by an array of photo detectors. The Brag grating can be tuned to either the hot or cold (red shifted or blue shifted) regions of the spectra. Should any of the detectors observe a signal, then a signal is immediately sent to the driver to divert the power from the emitter in question. The power is diverted for a predetermined time, in one embodiment, approximately three thermal time constants, before it is turned on again. By this means the performance and lifetime of the laser diode can be increased and phase lock is preserved in laser diode arrays. In some embodiments, it may not be necessary to remove the all the power, but instead decrease the power.

Figure 21:
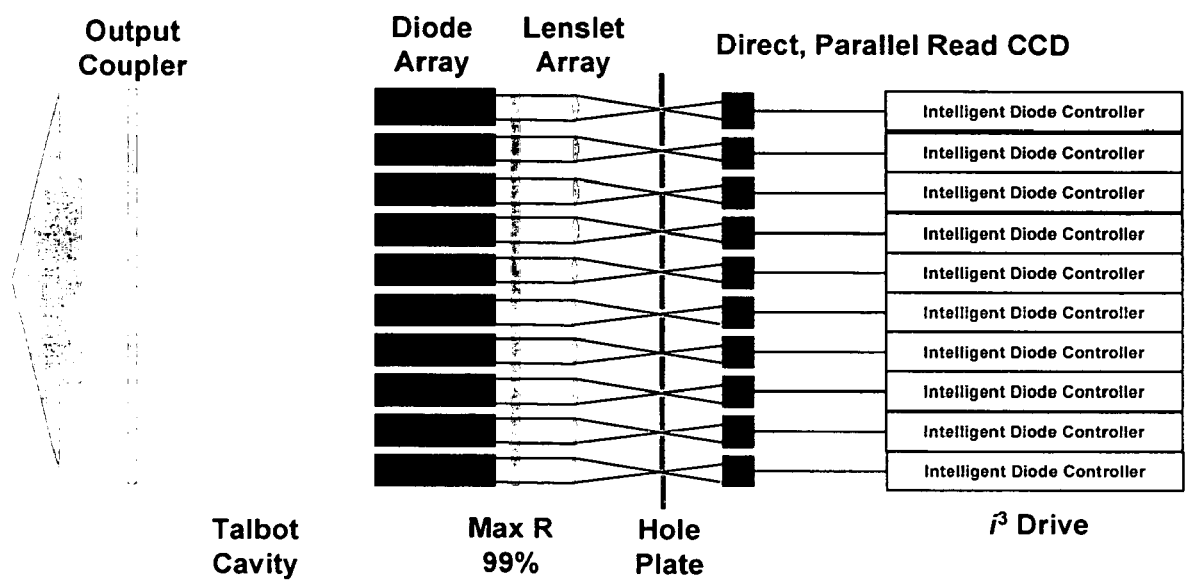

Another embodiment of this invention preserves the optical beam quality of an ensemble of diode lasers by monitoring the individual emitters to determine which emitter has a filament instability that could de-phase the ensemble. This embodiment is shown, schematically, in FIG. 21. In the embodiment shown in FIG. 21, the optical quality of the individual emitters are monitored by propagating the optical beams, of all the emitters, emanating from the max reflector end of the gain region. The optical beams are focused by a lens-let array through a pin hole and imaged onto optical detectors. Should any emitter have a filament then the optical quality will be degraded and the consequently the amplitude of the signal detected will decrease. Once this decrease in amplitude is detected, the power to the faulty emitter is removed rapidly. Again the power may or may not be completely removed. As before, the power can be reintroduced after approximately three thermal time constants. Alternate methods for detecting the degradation of the optical quality of the individual emitters are also within the scope of this invention.

Although the invention has been described with respect to various embodiments, it should be realized that this invention is also capable of a wide variety of further and other embodiments all within the spirit and scope of the appended claims.

What is claimed is:

1. A method for controlling phase in laser diodes, the method comprising the steps of:
  a. determining an indicator of phase of electromagnetic radiation emitted from a laser diode; the indicator of phase being also an indicator of anomalous behavior of the laser diode; the indicator of phase being obtained by measurement;
  b. comparing the indicator of phase to predetermined indicator behavior; and
  c. modifying operating conditions of the laser diode, if comparison results are not within a predetermined range;

wherein the step of determining an indicator of phase comprises the step of:

detecting a diode terminal voltage at substantially constant current; and wherein the predetermined indicator behavior is a predetermined behavior of the diode voltage.

* * * * *